US012685147B2

(12) United States Patent
Phung et al.

(10) Patent No.: US 12,685,147 B2
(45) Date of Patent: Jul. 14, 2026

(54) ACTIVE REGION ELECTRICALLY PROGRAMMABLE FUSE WITH GATE STRUCTURE AS SILICIDE BLOCK

(71) Applicant: GlobalFoundries Singapore Pte. Ltd., Singapore (SG)

(72) Inventors: Thanh Hoa Phung, Singapore (SG); Myo Aung Maung, Singapore (SG); Hari Balan, Singapore (SG); Anurag Swarnkar, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 391 days.

(21) Appl. No.: 18/303,865

(22) Filed: Apr. 20, 2023

(65) Prior Publication Data
US 2024/0355731 A1 Oct. 24, 2024

(51) Int. Cl.
H10W 20/49 (2026.01)
H10D 84/01 (2025.01)

(52) U.S. Cl.
CPC .......... H10W 20/493 (2026.01); H10D 84/01 (2025.01)

(58) Field of Classification Search
CPC ........................ H01L 23/5256; H10W 20/493
See application file for complete search history.

(56) References Cited

U.S. PATENT DOCUMENTS

| | | | |
|---|---|---|---|
| 6,911,360 B2 | 6/2005 | Li et al. | |
| 2007/0222028 A1 | 9/2007 | Matsuoka et al. | |
| 2013/0241031 A1* | 9/2013 | Li | H10B 69/00 |
| | | | 257/E23.149 |
| 2018/0182706 A1* | 6/2018 | Nomura | H10W 20/493 |

OTHER PUBLICATIONS

Hoefler et al., "Analysis of a Novel Electrically Programmable Active Fuse for Advanced CMOS SOI One-Time Programmable Memory Applications," 1-4244-0301-4/06, 20006 IEEE, 4 pages.

* cited by examiner

*Primary Examiner* — Tucker J Wright

(74) *Attorney, Agent, or Firm* — Yee Tze Lim; Hoffman Warnick LLC

(57) ABSTRACT

An electrically programmable fuse includes a first contact, a second contact spaced from the first contact, and a link between and electrically connecting the first contact and the second contact. The first contact, the second contact and the link include semiconductor material. A gate structure is partially over the link, leaving an uncovered link region uncovered by the gate structure. A silicide region is within the uncovered link region and provides an effective fuse link. The gate structure blocks silicide formation over an entirety of the fuse link, reducing the width of the effective fuse link, reducing the necessary programming current and the overall size of the electrically programmable fuse.

13 Claims, 16 Drawing Sheets

ACTIVE REGION ELECTRICALLY PROGRAMMABLE FUSE WITH GATE STRUCTURE AS SILICIDE BLOCK

BACKGROUND

The present disclosure relates to semiconductor structures and, more particularly, to an active region electrically programmable fuse with a gate structure as a silicide block to reduce a fuse link width.

Different parts of an integrated circuit (IC) may be coupled using an electrically programmable fuse (e-fuse). E-fuses can be 'programmed' to change their resistance states. More particularly, the material within the link of the fuse can be caused to migrate by application of a prescribed current controlled by a transistor. Once sufficient material has migrated, the fuse link's resistance is changed from low to high, which can significantly reduce a current passing through the fuse. One challenge presented by e-fuses is that they occupy a large footprint in ICs due to the size of the fuse and the associated current source needed to provide the necessary current to program them. Electrical fuses also include a planar fuse link that has a large footprint. One approach to reduce the size of e-fuses includes reducing the fuse link size to the minimum gate conductor width allowed by a technology node, and thus reducing the required current to program the e-fuse and the size of the required current source. Unfortunately, this approach limits the reduction in fuse link width to only the minimum gate conductor width.

SUMMARY

All aspects, examples and features mentioned below can be combined in any technically possible way.

An aspect of the disclosure provides an electrically programmable fuse, comprising: a first contact; a second contact spaced from the first contact; a link between and electrically connecting the first contact and the second contact, wherein the first contact, the second contact and the link include semiconductor material; a gate structure partially over the link, wherein an uncovered link region is uncovered by the gate structure; and a silicide region within the uncovered link region.

An aspect of the disclosure provides an electrically programmable fuse, comprising: a semiconductor fuse element including a first contact, a second contact spaced from the first contact and a link between and electrically connecting the first contact and the second contact; a gate structure partially over the link, wherein an uncovered link region is uncovered by the gate structure; and a silicide region within the uncovered link region.

An aspect of the disclosure provides a method, comprising: forming a semiconductor fuse element in a semiconductor layer, the semiconductor fuse element including a first contact, a second contact spaced from the first contact and a link between and electrically connecting the first contact and the second contact; forming a gate structure partially over the link, wherein an uncovered link region is uncovered by the gate structure; and forming a silicide region within the uncovered link region.

Two or more aspects described in this disclosure, including those described in this summary section, may be combined to form implementations not specifically described herein. The details of one or more implementations are set forth in the accompanying drawings and the description below. Other features, objects and advantages will be apparent from the description and drawings, and from the claims.

BRIEF DESCRIPTION OF THE DRAWINGS

The embodiments of this disclosure will be described in detail, with reference to the following figures, wherein like designations denote like elements, and wherein.

Figure 1:
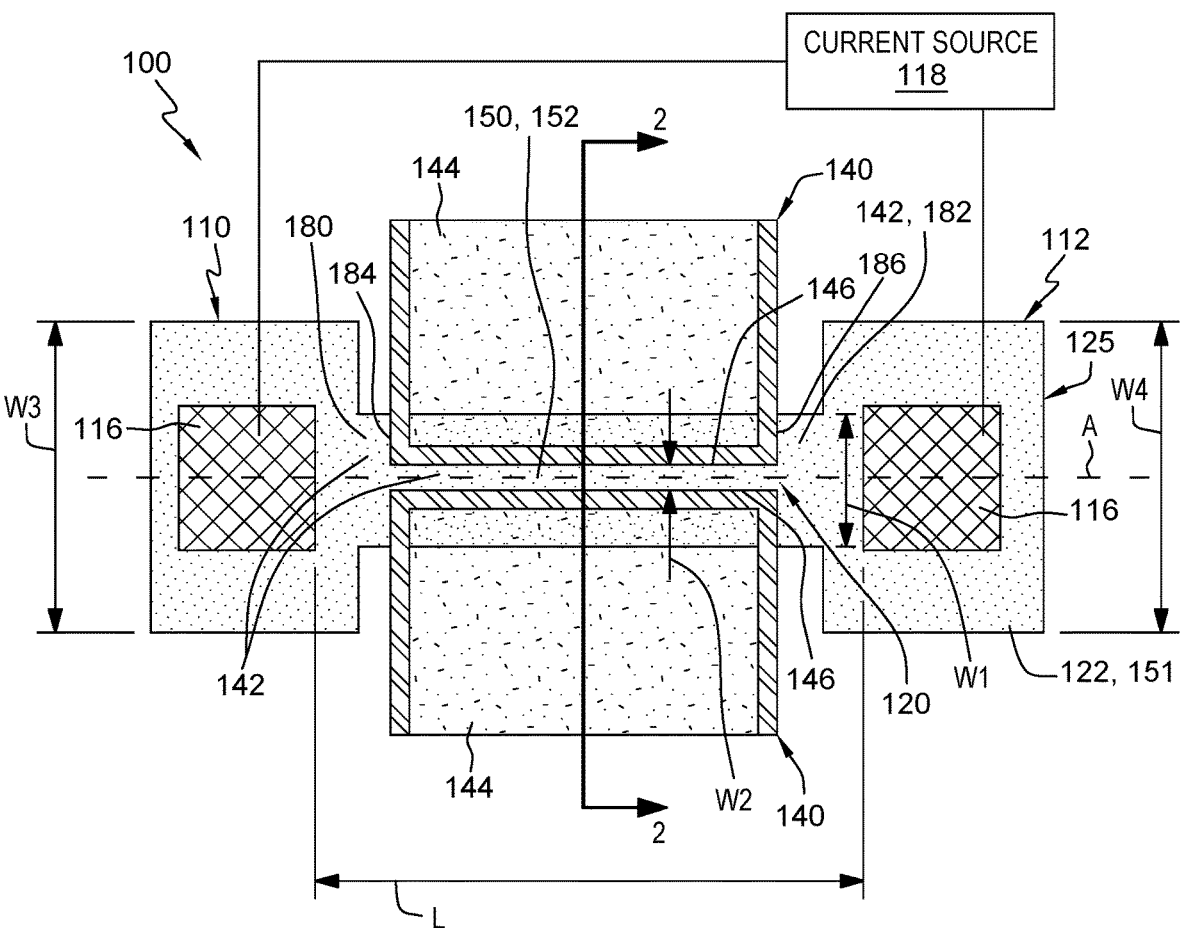
FIG. 1 shows a top-down view of an electrically programmable fuse, according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific illustrative embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

It will be understood that when an element such as a layer, region, or substrate is referred to as being "on" or "over" another element, it may be directly on the other element or intervening elements may also be present. In contrast, when an element is referred to as being "directly on" or "directly over" another element, there may be no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment. It is to be appreciated that the use of any of the following "/," "and/or," and "at least one of," for example, in the cases of "A/B," "A and/or B" and "at least one of A and B," is intended to encompass the selection of the first listed option (A) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Embodiments of the disclosure include an electrically programmable fuse and related methods of forming the electrically programmable fuse. The electrically programmable fuse includes a first contact, a second contact spaced from the first contact, and a link between and electrically connecting the first contact and the second contact. The first contact, the second contact and the link include semiconductor material. A gate structure is partially over the link, leaving an uncovered link region uncovered by the gate structure. A silicide region is within the uncovered link region. The gate structure can block silicide formation over a portion of the fuse link, effectively reducing the width of the fuse link. The effective fuse link with reduced width reduces the necessary programming current and the overall size of the electrically programmable fuse. The silicide region dimensions and that of the effective fuse link can be smaller than the minimum gate conductor width of a given technology node.

Figure 2:
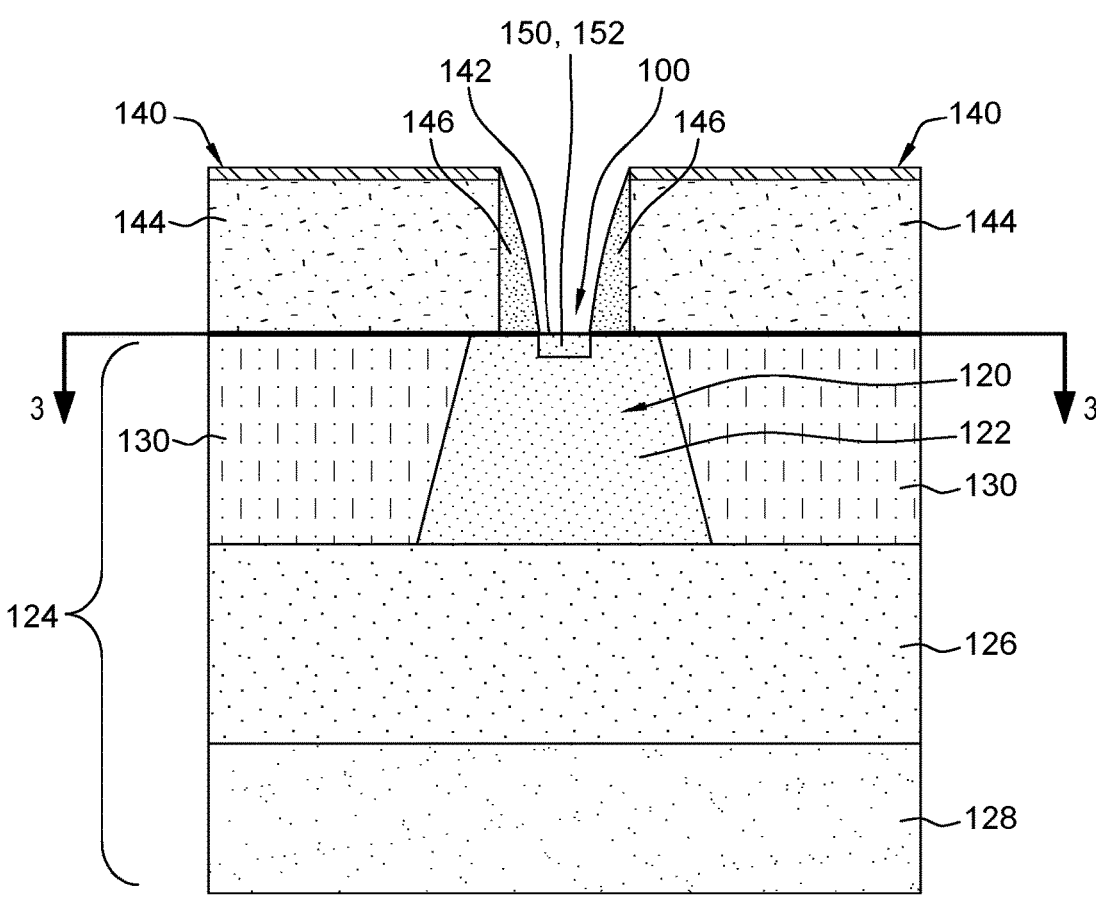
FIG. 2 shows a cross-sectional view along view line 2-2 in FIG. 1.
Figure 3:
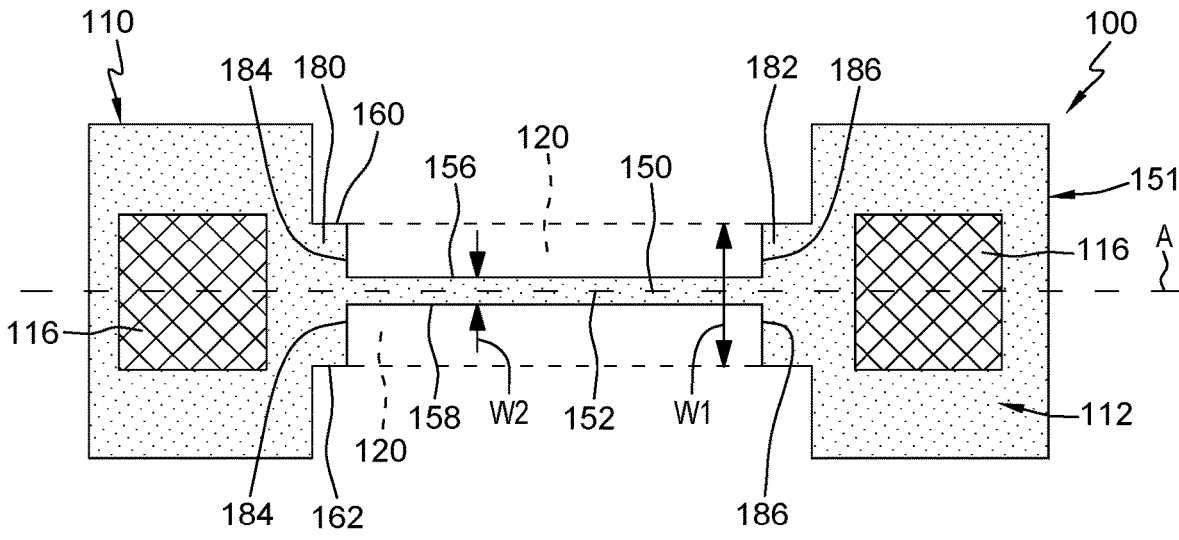
FIG. 3 shows a cross-sectional view along view line 3-3 in FIG. 2.

FIG. 1 shows a top-down view, FIG. 2 shows a cross-sectional view along view line 2-2 in FIG. 1 and FIG. 3 shows a cross-sectional view along view line 3-3 in FIG. 2 of an electrically programmable fuse 100, according to embodiments of the disclosure. Electrically programmable fuse or electronic fuse 100 (hereafter "e-fuse 100") may include a first contact 110 and a second contact 112 spaced from first contact 110. E-fuse 100 also includes a link or fuse link 120 (hereafter "link 120") between and electrically connecting first contact 110 and second contact 112.

E-fuse 100 is an active region electrically programmable fuse, meaning first contact 110, second contact 112 and link 120 include semiconductor material. More particularly, first contact 110, second contact 112 and link 120 may include semiconductor material in a semiconductor layer 122 in an integrated circuit (IC) structure that is otherwise used for forming active devices, such as transistors (not shown). Semiconductor layer 122 can be part of any now known or later developed form of semiconductor substrate for IC structures. In one example, semiconductor layer 122 may be part of a bulk semiconductor or, as shown in FIG. 2, a semiconductor-on-insulator (SOI) substrate 124. Collectively, first contact 110, second contact 112 spaced from first contact 110 and link 120 between and electrically connecting first contact 110 and second contact 112 provide a semiconductor fuse element 125 (FIG. 1 only) in semiconductor layer 122. First contact 110 and second contact 112 may include a wider portion of semiconductor layer 122 than link 120. First contact 110 and second contact 112, unlike link 120, may further include any variety of vertical contacts 116 thereto. Contacts 116 are shown with different shading than semiconductor layer 122, but as understood in the art, could include any number and/or shape of vertical contacts 116, e.g., cylindrical, trench, etc., in any interlayer dielectric (ILD) layer (not shown). Contacts 116 electrically couple to semiconductor layer 122 parts of first contact 110 and/or second contact 112. As understood in the art, contacts 116 are electrically coupled to a current source 118 (shown schematically in FIG. 1 only) that supplies a programming current to e-fuse 100. Current source 118 may include any now known or later developed current supply with any necessary control transistor(s).

With further regard to the example substrate, SOI substrate 124 includes a layered semiconductor-insulator-semiconductor substrate in place of a more conventional silicon substrate (bulk substrate). SOI substrate 124 includes a semiconductor-on-insulator (SOI) layer (i.e., layer 122) over a buried insulator layer 126 over a base semiconductor layer 128. Semiconductor layer 122 and base semiconductor layer 128 may include a material whose conducting properties can be altered by doping with an impurity. Semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region. Furthermore, when a semiconductor region or layer is described as being at a higher conductivity level than another semiconductor region or layer, it is more conductive (less resistive) than the other semiconductor region or layer; whereas, when a semiconductor region or layer is described as being at a lower conductivity level than another semiconductor region or layer, it is less conductive (more resistive) than that other semiconductor region or layer.

Buried insulator layer 126 may include any appropriate dielectric such as but not limited to silicon dioxide, i.e., forming a buried oxide (BOX) layer. The precise thickness of buried insulating layer 126 and semiconductor layer 122 may vary widely with the intended application.

First contact 110, second contact 112 and link 120 may be horizontally shaped and electrically isolated from other structures by isolation structures 130, such as shallow trench isolations. Isolation structures 130 may be formed using any now known or later developed techniques, e.g., a trench etched into the substrate and filled with an insulating material such as oxide. Isolation structures 130 electrically and structurally isolate one region of the IC structure from an adjacent region thereof. Each isolation structure 130 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (Si-COH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

E-fuse 100 also includes a gate structure 140 partially over link 120, wherein an uncovered link region 142 is uncovered by gate structure 140. Uncovered link region 142 is described herein as "uncovered" because gate structure 140 is not over it. Rather, gate structure 140 covers only part of link 120. As described herein, gate structure 140 may include one or more gate structures. For example, FIGS. 1 and 2 show two spaced apart gate structures 140. In any event, gate structures 140 are inactive or dummy gates, meaning they are formed the same as any active gate structures used for transistors elsewhere in the IC structure in which e-fuse 100 is used, but they are not used as part of an operative transistor. As will be further described, and as will be recognized by those will skill in the art, uncovered link region 142 will have material over it other than gate structure 140, such as silicide region 150 and ILD layers (not shown).

Each gate structure 140 may include a body 144 and a spacer or spacers 146 adjacent sidewall(s) of body 144. Body 144 may be made of any now known or later developed gate conductor material such as a polysilicon or a metal, i.e., collectively referenced as polyconductors. As understood in the art, the gate conductor material may vary depending on the particular technology node in which used, e.g., 14 nanometer (nm), 22 nm, etc. Where a metal is used, it may include at least one metal layer (not shown separately) such as but not limited to a work function metal layer and a gate conductor layer. A gate dielectric layer (not shown) may also be part of body 144 of gate structure(s) 140. Spacer(s) 146 can be made of a sidewall spacer material. The sidewall spacer material can be, for example, silicon nitride, silicon carbon nitride, silicon boron carbon nitride or any other suitable dielectric gate sidewall spacer material that will remain essentially intact during other processing (e.g., silicide formation, replacement metal gate (RMG) processing, among other processes). Although not shown, spacer(s) 146 may include multiple layers. Formation of gate structure 140 will be described further herein. Spacer(s) 146 define widths W2, W2A, W2B, as described elsewhere herein.

E-fuse 100 may also include a silicide region 150 within uncovered link region 142. Silicide region 150 is an area of high conductivity silicon-metal alloy within uncovered link region 142 between or adjacent to gate structure(s) 140. As shown in FIGS. 1 and 3, link 120, first contact 110 and second contact 112 define a longitudinal axis A. Link 120 has a link width W1 defined perpendicular to longitudinal axis A between a first edge 160 of link 120 and a second edge 162 of link 120. Silicide region 150 has a silicide width W2 defined perpendicular to longitudinal axis A between a first edge 156 of silicide region 150 and a second edge 158 of silicide region 150.

Typically, all of fuse link 120 is covered with silicide, and the necessary programming current is dictated by link width W1. In accordance with embodiments of the disclosure, the location of gate structure(s) 140 over link 120 controls the effective width (silicide width W2) (and uncovered link region 142 of semiconductor layer 122 of link 120 within which silicide region 150 is formed). Uncovered link region 142 and hence silicide region 150 are sized by the location of gate structure(s) 140 to allow formation of silicide region 150 having silicide width W2 that is smaller than link width W1 of link 120. More particularly, gate structure(s) 140 can be used to size uncovered link region 142 and silicide region 150 to be smaller than link 120, e.g., compare link width W1 of link 120 to silicide width W2 of silicide region 150. In this manner, silicide region 150 adjacent to or between gate conductor(s) 140 provides an 'effective fuse link' 152 that has a smaller width than the underlying link 120 and requires less programming current. Advantageously, silicide region 150 and effective fuse link 152 can also have silicide width W2 smaller than a minimum gate conductor width allowed by the particular technology node in which used. In view of the foregoing, e-fuse 100 requires less area in an IC structure, requires less programming current and can use a smaller current source 118 (FIG. 1) than conventional active region e-fuses.

Silicide region 150 may be formed using any now known or later developed technique, e.g., performing an in-situ pre-clean, depositing a metal such as titanium, nickel, cobalt, etc. on uncovered link region 142, annealing to have the metal react with semiconductor layer 122, and removing unreacted metal, e.g., using an etch. Silicide region 150 may include any variety of silicide or polysilicide depending on the metal selected. Silicide region 150 may be referred to as self-aligned silicide (also referred to as "salicide") because gate structure(s) 140, perhaps with an edge 160, 162 of link 120, directs its alignment over uncovered region 142. As used herein "self-aligned" means that specific surfaces of silicide region 150 extend to controllable distances horizontally within semiconductor layer 122. An inherent advantage of a self-aligned fabrication process according to the present disclosure is that silicide region 150 and effective fuse link 152 is formed to a smaller width than would otherwise be possible.

In FIGS. 1-3, silicide region 150 has silicide width W2 that is within link 120, i.e., within link width W1. In this case, first edge 156 and second edge 158 of silicide region 150 (and effective fuse link 152) are both within first edge 160 and second edge 162 of link 120. It will be recognized, as shown in FIG. 3, that other regions of semiconductor layer 122, such as first contact 110, second contact 112 and perhaps other uncovered regions of link 120 may also include silicide. FIG. 3 shows a top-down view of the shape of a silicide layer 151 of e-fuse 100, i.e., under gate structure(s) 140 (not shown) and within an upper surface of semiconductor layer 122 (FIG. 1).

A size and arrangement of link 120 and silicide region 150 (latter defined by gate structure(s) 140) can be user defined to provide the desired effective fuse link 152.

As noted, in FIGS. 1-3, silicide region 150 has silicide width W2 that is within link 120, i.e., within link width W1. In FIGS. 1-3, silicide region 150 is between first edge 160 of link 120 and second edge 162 of link 120. More particularly, first edge 156 and second edge 158 of silicide region 150 are within first edge 160 and second edge 162 of link 120, respectively. In FIGS. 1-3, silicide region 150 is centered (vertically) within link 120; however, this is not necessary in all cases.

As shown in FIGS. 1 and 3, in semiconductor layer 122 (FIG. 2) or silicide layer 151, at least one of first contact 110 and second contact 112 have respective widths W3, W4 defined perpendicular to the longitudinal axis A that are larger than link width W1 (and silicide width W2). In FIGS. 1 and 3, in semiconductor layer 122, first and second contacts 110, 112 may have the same widths, i.e., W3=W4

(they may also be the same or different lengths (along axis A) in semiconductor layer 122).

Figure 4:
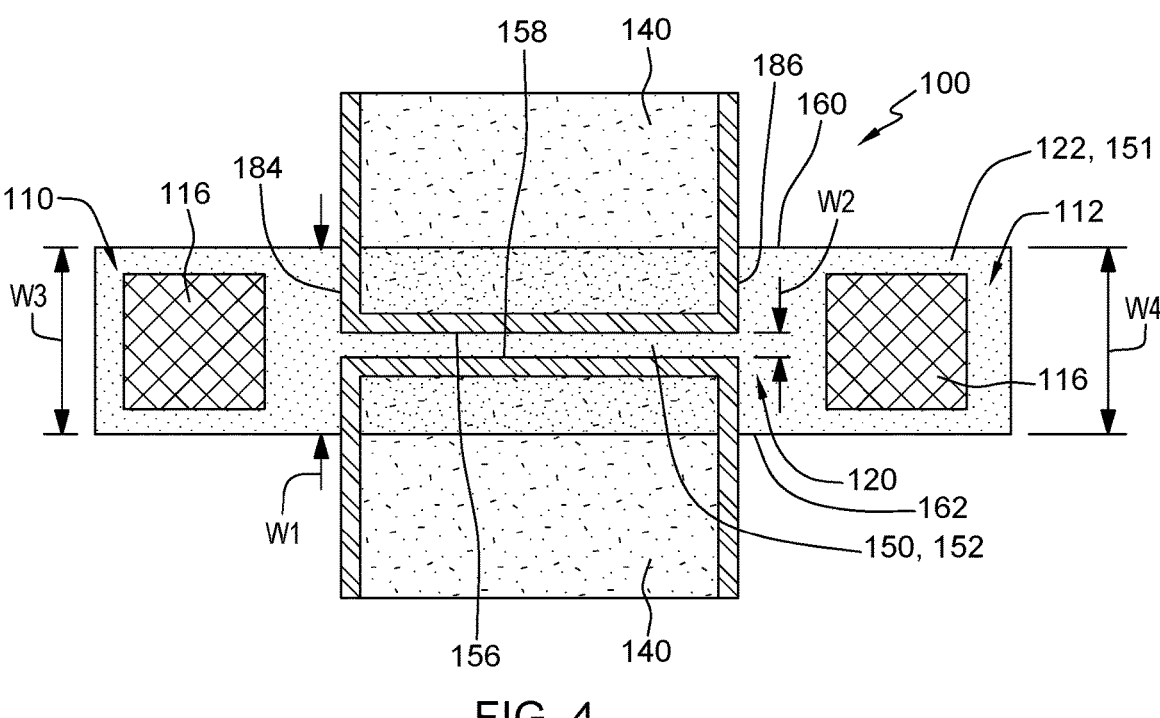
FIG. 4 shows a top-down view of an electrically programmable fuse, according to other embodiments of the disclosure.
Figure 5:
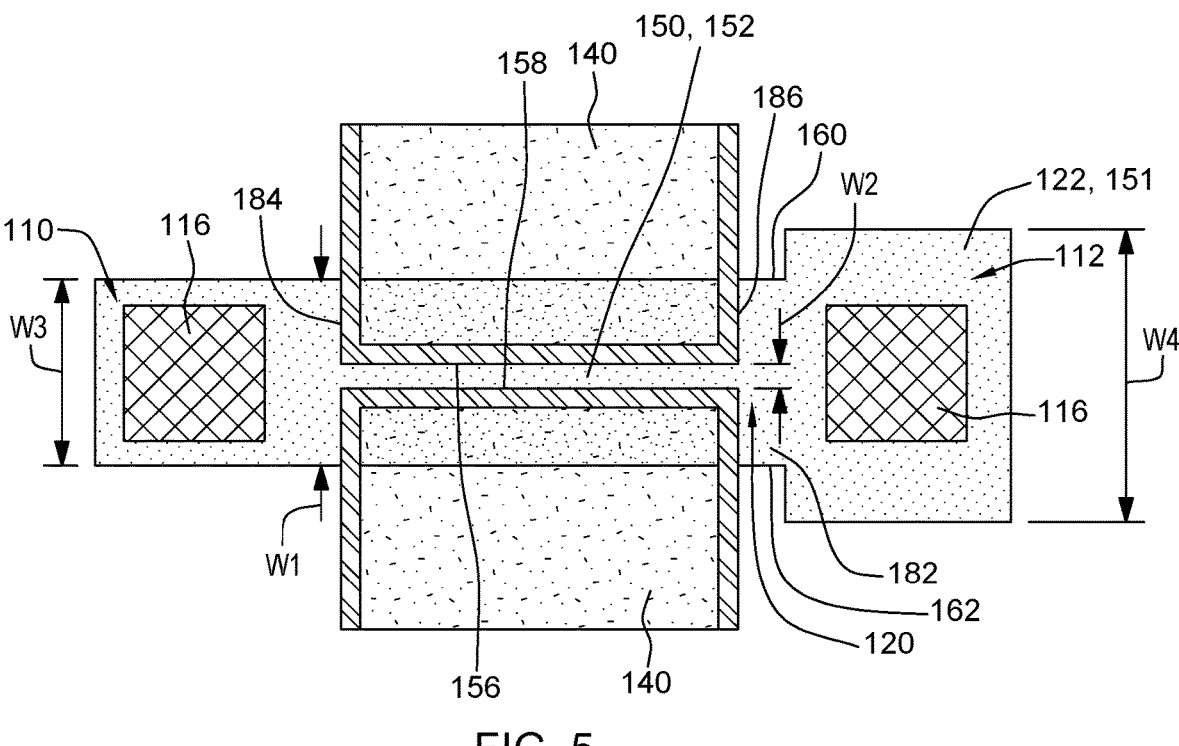
FIG. 5 shows a top-down view of an electrically programmable fuse, according to yet other embodiments of the disclosure.
Figure 6:
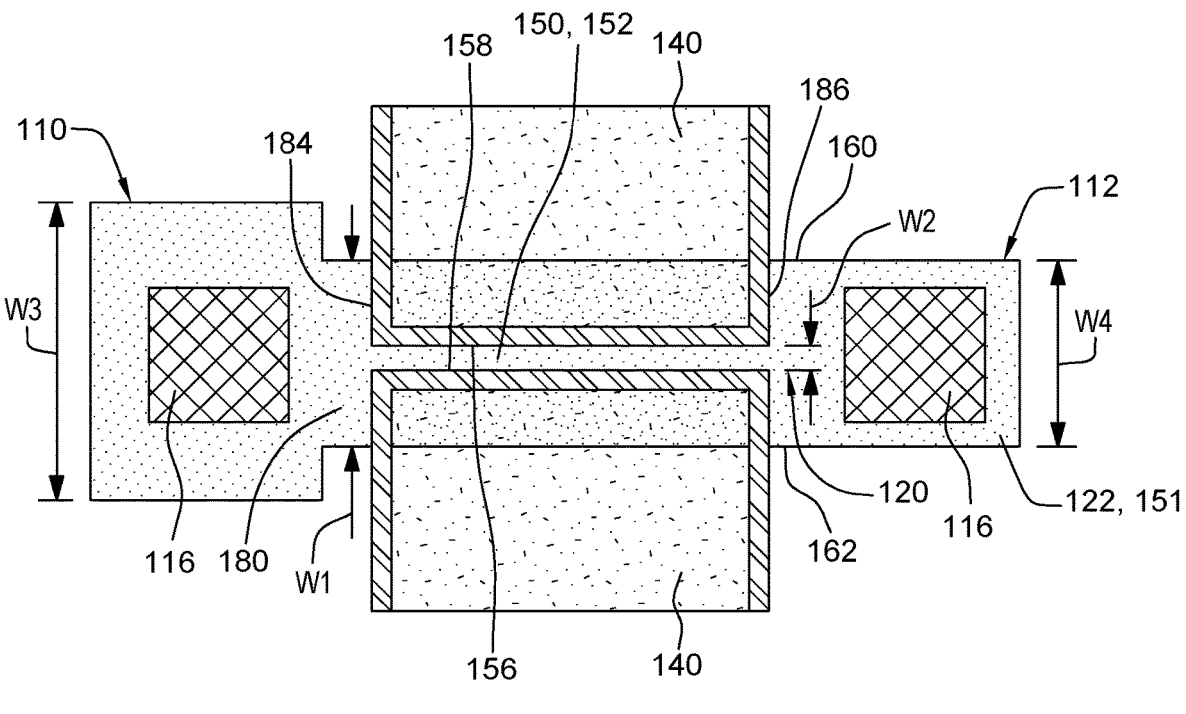
FIG. 6 shows a top-down view of an electrically programmable fuse, according to other embodiments of the disclosure.

FIGS. 4-6 show top-down views of other embodiments of e-fuse 100 based on the FIGS. 1-3 embodiments. In FIG. 4, first contact 110 and second contact 112 have respective widths W3, W4 in semiconductor layer 122 defined perpendicular to the longitudinal axis A that are the same as link width W1, but larger than silicide width W2 of silicide region 150. In FIG. 4 (as in FIGS. 1 and 3), in semiconductor layer 122, first and second contacts 110, 112 may have the same widths, i.e., W3=W4 (they may also be the same or different lengths (along axis A) in semiconductor layer 122). However, as shown in FIGS. 5 and 6, in semiconductor layer 122, first and second contacts 110, 112 may have different widths, i.e., W3/W4. In any case, first and second contacts 110, 112 may have any length (along axis A) in semiconductor layer 122.

Link 120 has a link length L (FIG. 1 only for clarity) between contacts 116 of first contact 110 and contacts 116 of second contact 112. As shown in FIGS. 1 and 3-6, gate structure(s) 140 is/are generally centered between contacts 110, 112 on link 120 in a lengthwise direction, i.e., along axis A (FIG. 1 only for clarity). More particularly, gate structure(s) 140 is/are generally centered between contacts 116 of contacts 110, 112 on link 120 in a lengthwise direction, i.e., along axis A (FIG. 1 only for clarity). Silicide region 150 is over an entirety of the link length L, i.e., it extends between contacts 116 of contacts 110, 112. However, gate structure(s) 140 are only over a portion of link length L. In certain embodiments, where semiconductor layer 122 parts of first contact 110 and second contact 112 are wider than link 120, silicide end regions 180, 182 (FIGS. 1 and 3) may be also provided outside of uncovered link region 142 of link 120 between longitudinal ends 184, 186 (FIGS. 1 and 3) of gate structure(s) 140 (FIG. 1) and the wider semiconductor layer 122 parts of first contact 110 and second contact 112. In FIGS. 1 and 3, both silicide end regions 180, 182 exist between ends 184, 186 of gate structure 140 and the wider semiconductor layer 122 parts of first and second contacts 110, 112. In FIG. 5, only silicide end region 182 exists between end 186 of gate conductor 140 and wider semiconductor layer 122 part of second contact 112, and in FIG. 6, only silicide end region 180 exists between end 184 of gate conductor 140 and wider semiconductor layer 122 part of first contact 110.

Figure 7:
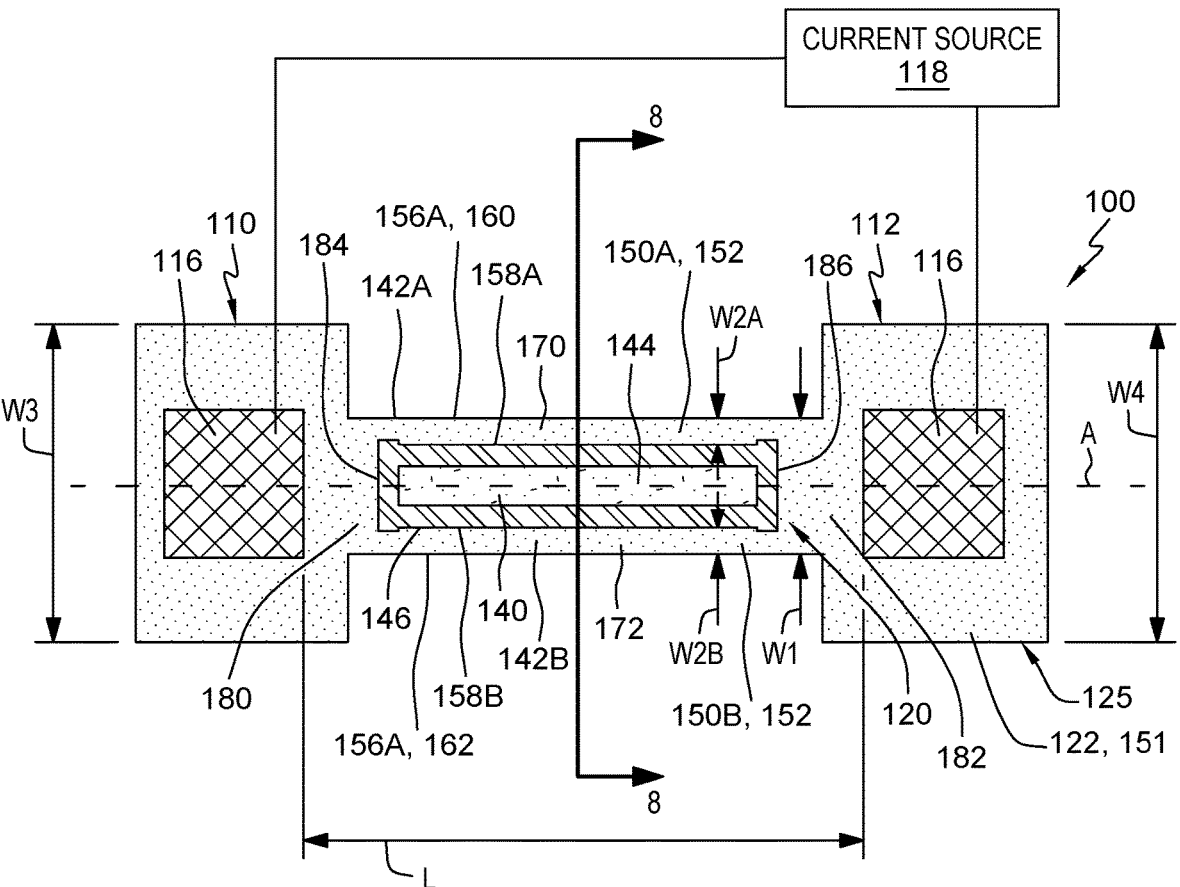
FIG. 7 shows a top-down view of an electrically programmable fuse, according to embodiments of the disclosure.

Link 120 has a link length L (FIG. 1 only for clarity) between contacts 116 of first contact 110 and contacts 116 of second contact 112. Silicide region 150 (see e.g., FIG. 1) extends between contacts 116 of first contact 110 and contacts 116 of second contact 112. In FIGS. 1, 3-6, gate structures 140 are generally centered between contacts 110, 112 on link 120 in a lengthwise direction, i.e., along axis A (FIG. 7 only for clarity). However, this arrangement is not necessary in all cases. In FIGS. 1 and 3, where both silicide end regions 180, 182 exist, they may have the same or different length along axis A depending on the centered-ness of gate structures 140. In addition, while two gate structures 140 with longitudinal ends 184, 186 are shown aligned along longitudinal axis A in FIGS. 1, 3-6, this is not required, i.e., gate structures 140 can be non-aligned at one or both ends. Hence, silicide end regions 180, 182, where both are provided, may have the same or different length along axis A depending on the centered-ness of gate structure(s) 140.

Figure 8:
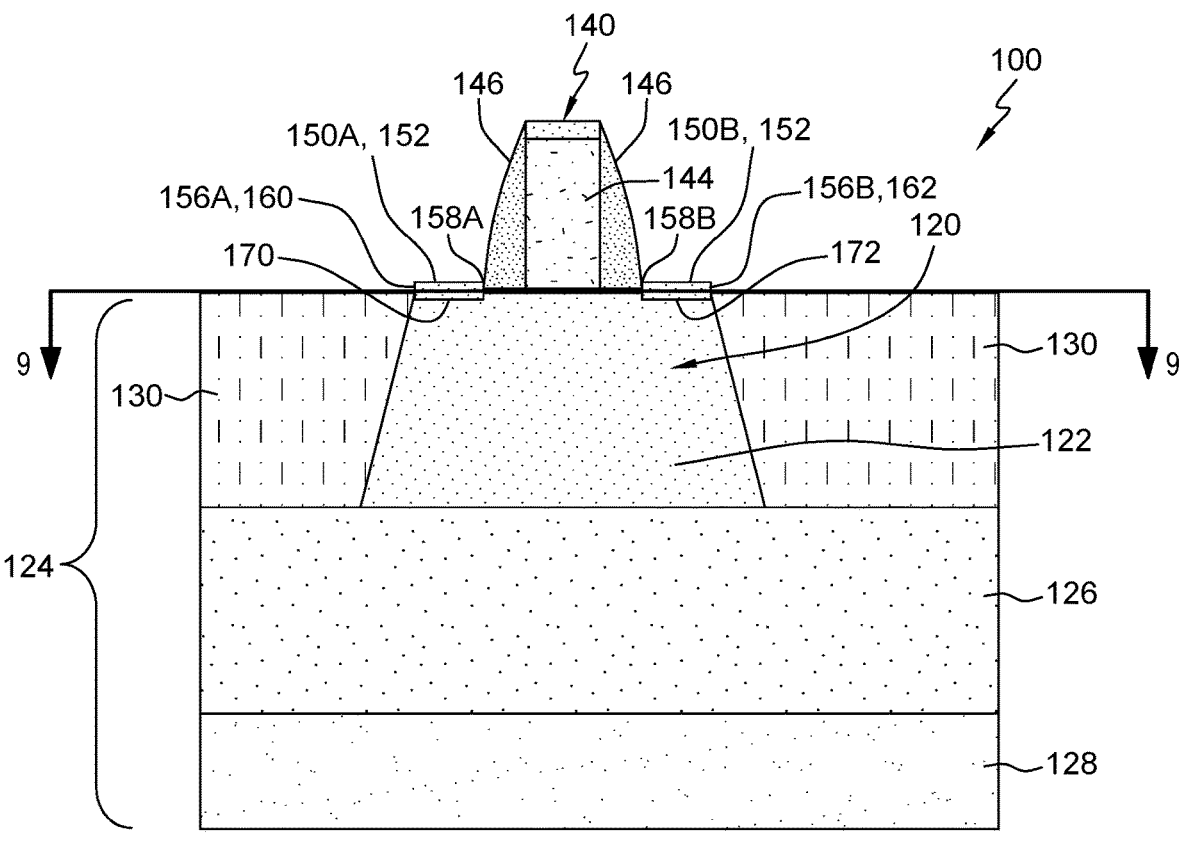
FIG. 8 shows a cross-sectional view along view line 8-8 in FIG. 7.
Figure 9:
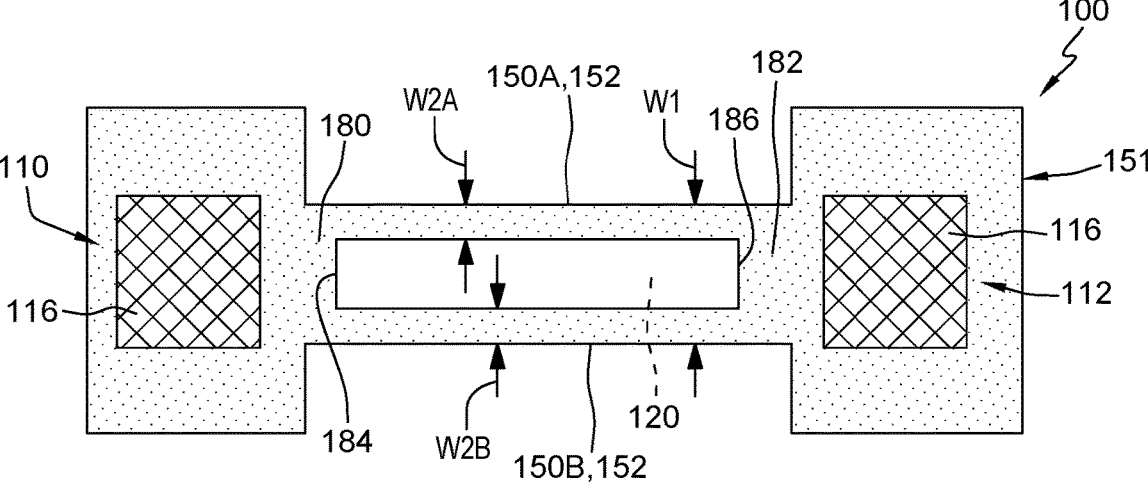
FIG. 9 shows a top-down view along view line 9-9 in FIG. 8.

FIG. 7 shows a top-down view, FIG. 8 shows a cross-sectional view along view line 8-8 in FIG. 7 and FIG. 9 shows a cross-sectional view along view line 9-9 in FIG. 8 of e-fuse 100, according to other embodiments of the disclosure. In FIGS. 7-9, a single gate structure 140 is partially over link 120, leaving uncovered regions 142A, 142B (FIG. 7) between gate structure 140 and first and second edges 160, 162 of link 120, respectively. Silicide region 150 includes two silicide regions 150A, 150B, collectively creating effective fuse link 152. More particularly, silicide region 150 includes a first silicide region 150A within a first edge surface 170 (FIGS. 8-9) at first edge 160 of link 120 and a second silicide region 150B within a second edge surface 172 at second edge 162 of link 120. First silicide region 150A has a silicide width W2A and second silicide region 150B has a silicide width W2B. Single gate structure 140 is shown centered vertically over link 120, i.e., between contacts 116 of first and second contacts 110, 112; however, this is not necessary in all cases. Hence, silicide widths W2A, W2B may be equal (as shown) or unequal. FIG. 9 shows a silicide layer 151 of e-fuse 100, i.e., under gate structure 140 and within an upper surface of semiconductor layer 122.

Figure 10:
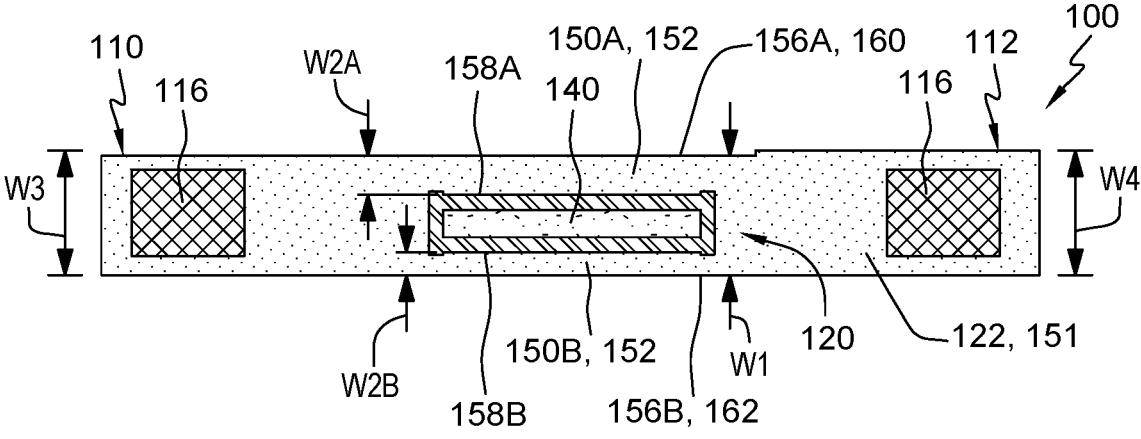
FIG. 10 shows a top-down view of an electrically programmable fuse, according to other embodiments of the disclosure.
Figure 11:
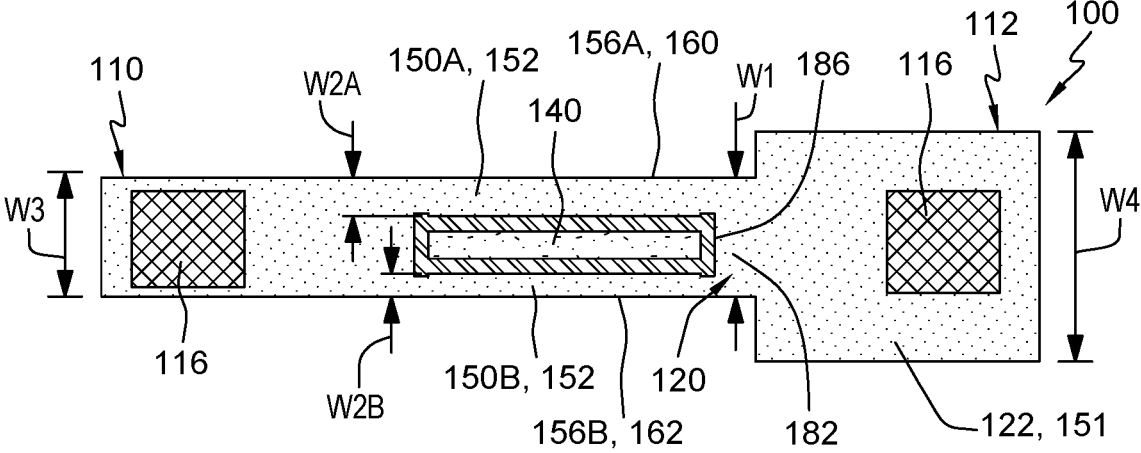
FIG. 11 shows a top-down view of an electrically programmable fuse, according to yet other embodiments of the disclosure.
Figure 12:
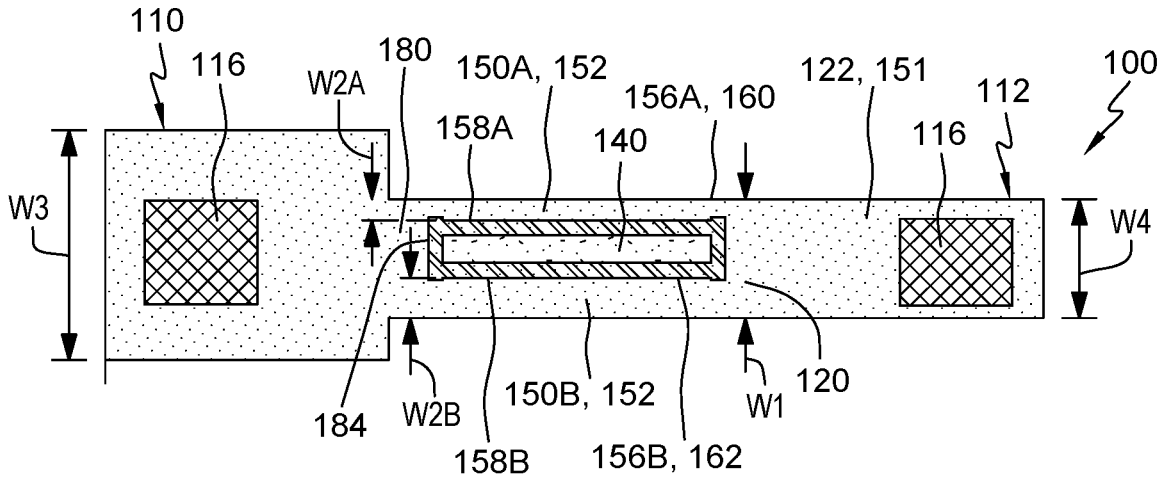
FIG. 12 shows a top-down view of an electrically programmable fuse, according to other embodiments of the disclosure.

FIGS. 10-12 show top-down views of other embodiments of e-fuse 100 based on the FIGS. 7-9 embodiments. In FIG. 10, in semiconductor layer 122, first contact 110 and second contact 112 have respective widths W3, W4 defined perpendicular to longitudinal axis A (see FIG. 7) that are the same as link width W1, but larger than either silicide width W2A, W2B. In this case, no silicide end regions 180, 182 exist over link 120. In FIGS. 7, 9 and 10, first and second contacts 110, 112 may have the same widths, i.e., W3=W4, in semiconductor layer 122 (they may also be the same or different lengths (along axis A) in semiconductor layer 122). However, as shown in FIGS. 11 and 12, in semiconductor layer 122, first and second contacts 110, 112 may have different widths, i.e., W3/W4. In any event, first and second contacts 110, 112 may be the same or different lengths (along axis A). Where semiconductor layer 122 and parts of first contact 110 and/or second contact 112 are wider than link 120 (i.e., W3>W1 and/or W4>W1), silicide end regions 180, 182 may exist over link 120. In FIGS. 7 and 9, both silicide end regions 180, 182 exist between ends 184, 186 of gate structure 140 and the wider semiconductor layer 122 parts of first and second contacts 110, 112. In FIG. 11, only silicide end region 180 exists between end 184 of gate conductor 140 and wider semiconductor layer 122 part of first contact 110, and in FIG. 12, only silicide end region 182 exists between end 186 of gate conductor 140 and wider semiconductor layer 122 part of second contact 112.

Link 120 has a link length L (FIG. 7 only for clarity) between contacts 116 of first contact 110 and contacts 116 of second contact 112. Silicide regions 150A, 150B (see e.g., FIG. 9) extend between contacts 116 of first contact 110 and contacts 116 of second contact 112. In FIGS. 7-12, gate structure 140 is generally centered between contacts 110, 112 on link 120 in a lengthwise direction, i.e., along axis A (FIG. 7 only for clarity). However, this arrangement is not necessary in all cases. In FIGS. 7 and 9, where both silicide end regions 180, 182 exists, they may have the same or different length along axis A depending on the centered-ness of gate structure(s) 140.

FIGS. 13-17 show top-down views of other embodiments of e-fuse 100 based on the FIGS. 7 and 9-12 embodiments. FIGS. 13-16 are substantially identical to FIGS. 7, 10, 11 and 12, respectively, except gate structure 140 (FIGS. 7, 10-12) is longer. In these embodiments, link 120 has link length L1 between first contact 110 and second contact 112 (between contacts 116 thereof) and gate structure 140 is over a portion of link length L. Where contacts 110, 112 have semiconductor layer 122 parts that are wider than link 120

Figure 16:
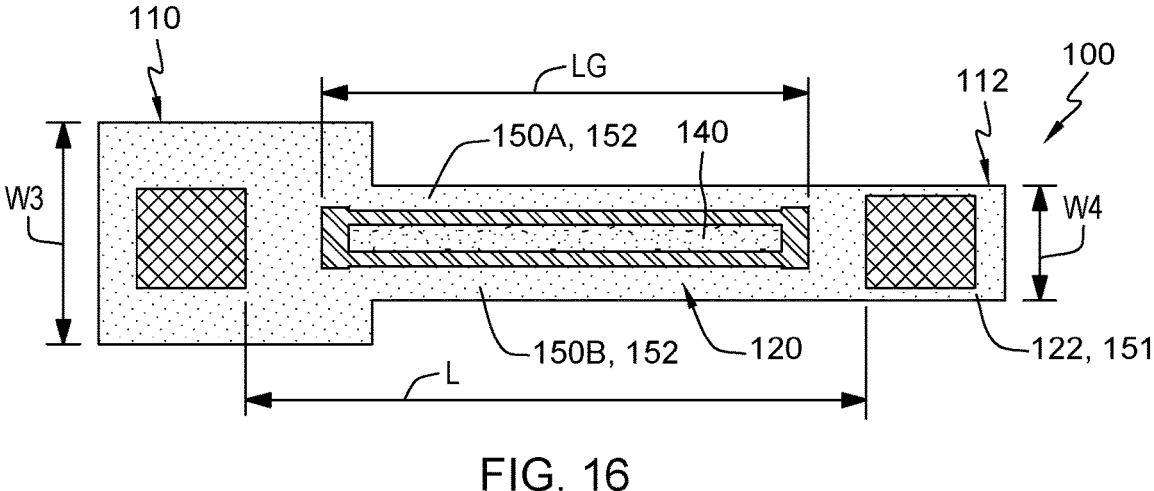
FIG. 16 shows a top-down view of an electrically programmable fuse, according to additional embodiments of the disclosure.
Figure 17:
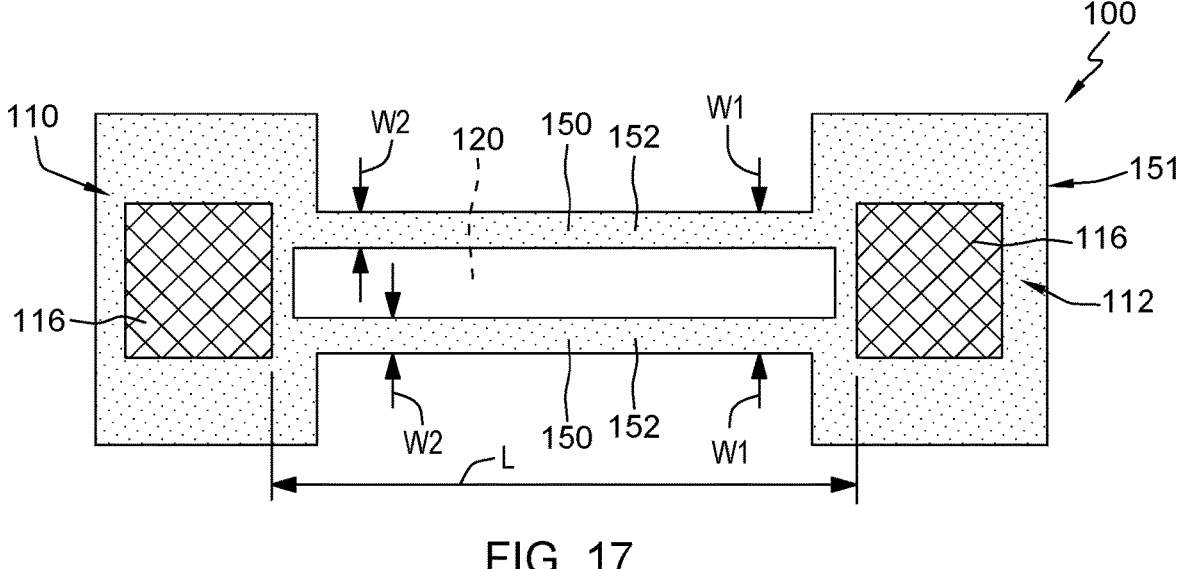
FIG. 17 shows a top-down view of an electrically programmable fuse, according to embodiments of the disclosure.

(FIGS. 13, 15 and 16), gate structure 140 extends over a portion of at least one of first contact 110 and second contact 112, i.e., the wider (than link 120) semiconductor layer 122 portion of one or both contacts 110, 112. The longer gate structure 140 may eliminate silicide end regions 180, 182 (FIGS. 7 and 9) over link 120 in some cases. FIG. 17 shows silicide layer 151 of e-fuse 100, i.e., under gate structures 140 and within an upper surface of semiconductor layer 122.

Figure 13:
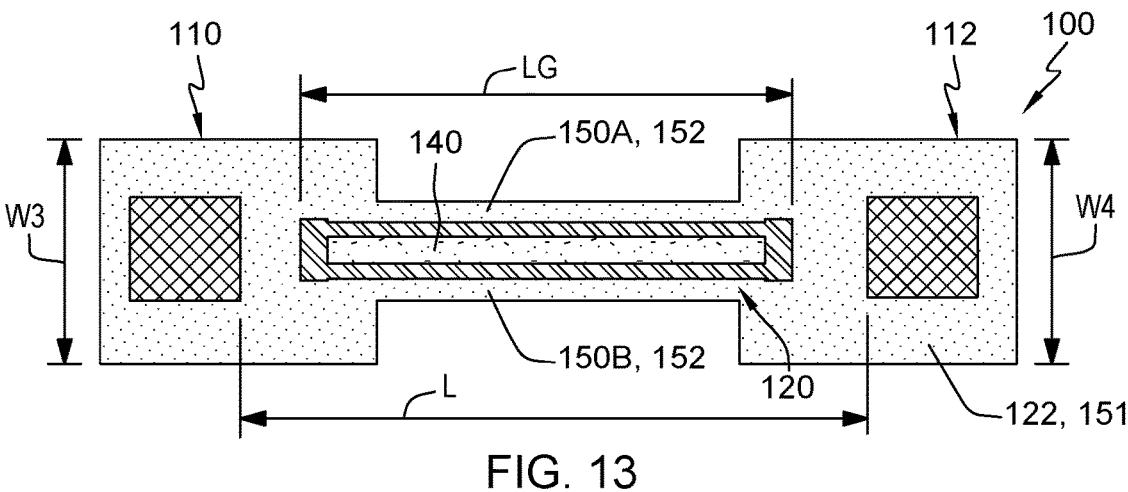
FIG. 13 shows a top-down view of an electrically programmable fuse, according to other embodiments of the disclosure.
Figure 14:
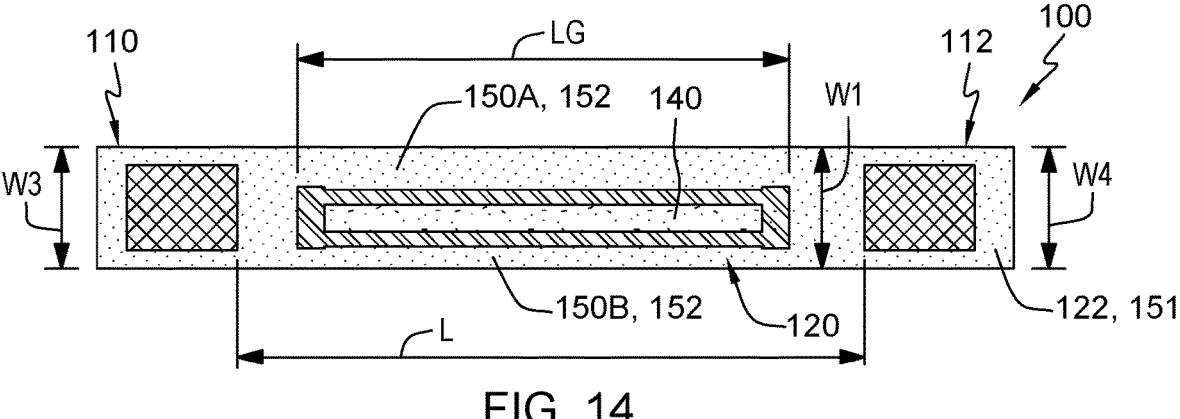
FIG. 14 shows a top-down view of an electrically programmable fuse, according to yet other embodiments of the disclosure.
Figure 15:
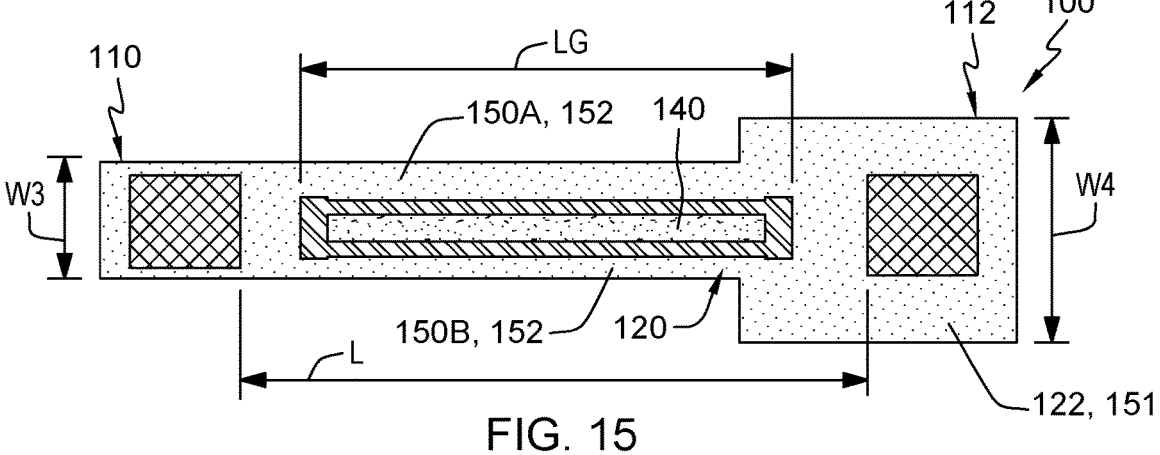
FIG. 15 shows a top-down view of an electrically programmable fuse 100, according to other embodiments of the disclosure.

In FIG. 13, first contact 110 and second contact 112 have respective widths W3, W4 in semiconductor layer 122 defined perpendicular to the longitudinal axis A that are the same as link width W1, but larger than either silicide width W2A, W2B. In FIGS. 13 and 14, in semiconductor layer 122, first and second contacts 110, 112 may have the same widths, i.e., W3=W4, in semiconductor layer 122 (they may also be the same or different lengths (along axis A) in semiconductor layer 122). However, as shown in FIGS. 15 and 16, the semiconductor layer 122 parts of first contact 110 and second contacts 112 may have different widths, i.e., W3/W4. They may also be the same or different lengths (along axis A) in semiconductor layer 122.

FIG. 17 is similar to FIG. 9 except no silicide end regions 180, 182 exist over link 120 in FIG. 17. Where semiconductor layer 122 parts of first contact 110 and/or second contact 112 is wider than link 120 (i.e., W3>W1 and/or W4>W1), gate structure 140 may extend over a portion of at least one of semiconductor layer 122 parts of first contact 110 and second contact 112. In FIGS. 13 and 17, gate structure 140 extends over both semiconductor layer 122 parts of first contact 110 and second contact 112. In this manner, as shown in FIGS. 13 and 17, first and second silicide regions 150A, 150B extend over an entirety of link 120 in a lengthwise direction, i.e., there are no silicide end regions 180, 182 (FIGS. 1, 3, 5-7, 11, 12). FIG. 15 shows gate structure 140 extending over just semiconductor layer 122 part of second contact 112, and FIG. 16 shows gate structure 140 extending over just semiconductor layer 122 part of first contact 110. In FIG. 14, link 120, first contact 110 and second contact 112 in semiconductor layer 122 may have a uniform width, i.e., W1=W3=W4.

Figure 18:
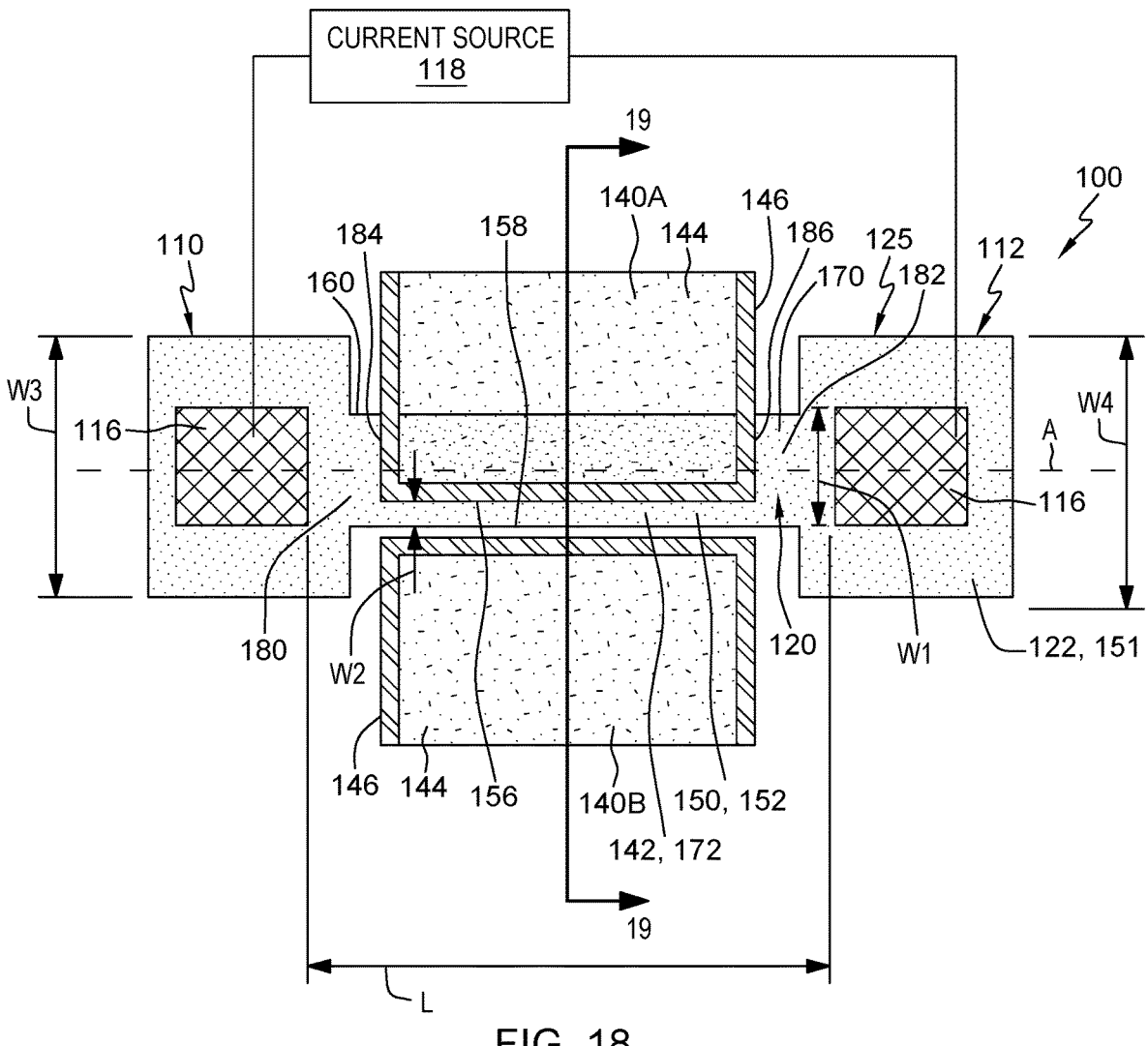
FIG. 18 shows a top-down view of an electrically programmable fuse, according to embodiments of the disclosure.
Figure 19:
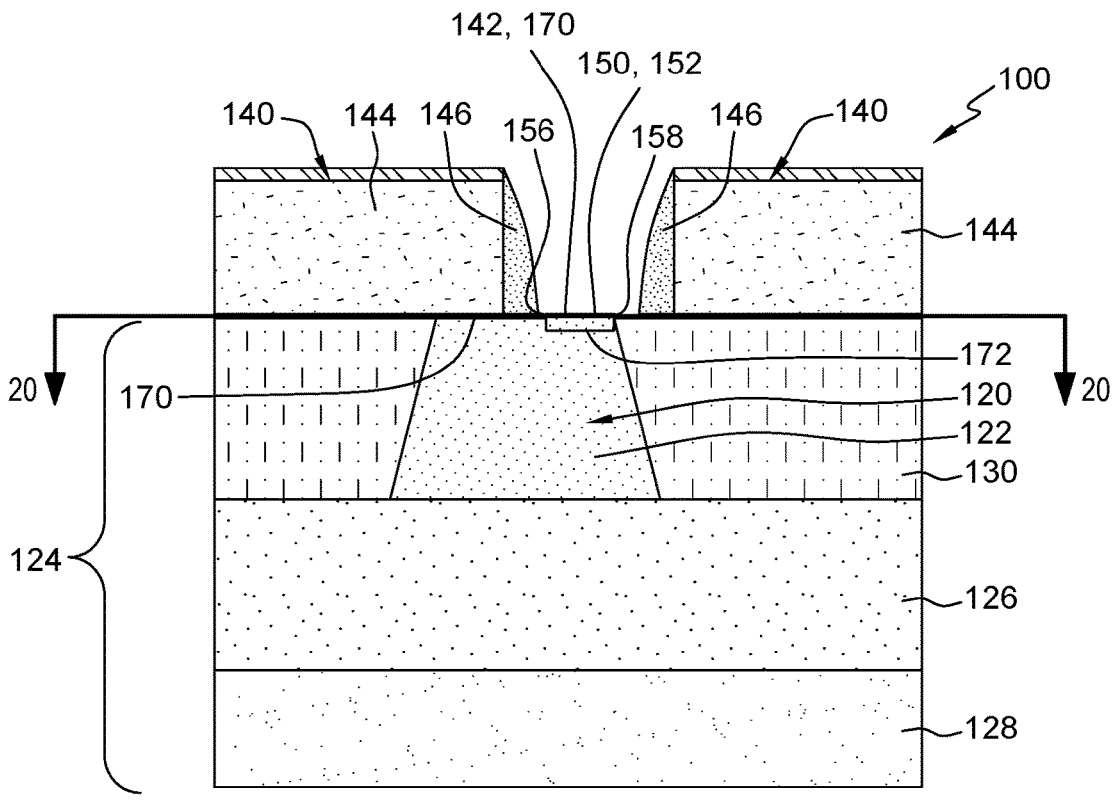
FIG. 19 shows a cross-sectional view along view line 19-19 in FIG. 18.
Figure 20:
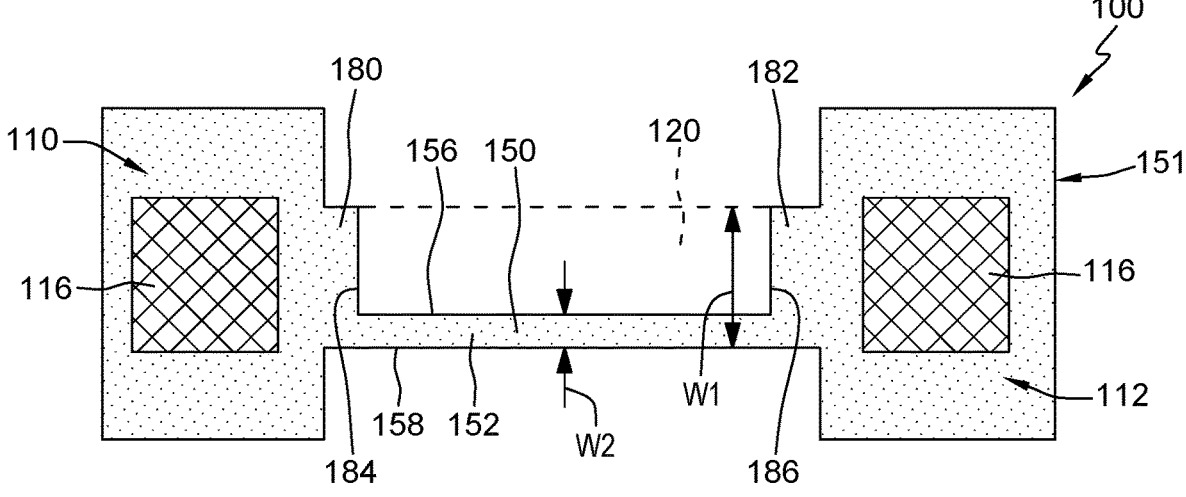
FIG. 20 shows a top-down view along view line 20-20 in FIG. 19.

FIG. 18 shows a top-down view, FIG. 19 shows a cross-sectional view along view line 19-19 in FIG. 18 and FIG. 20 shows a cross-sectional view along view line 20-20 in FIG. 19 of e-fuse 100, according to other embodiments of the disclosure. In FIGS. 18-20, gate structure 140A is partially over link 120 and uncovered link region 142 is uncovered by gate structure 140A. However, silicide region 150 is within only one of first edge surface 170 at first edge 160 of link 120 and (as shown) second edge surface 172 at second edge 162 of link 120. In this embodiment, a single gate structure 140A is arranged over link 120 in a manner leaving one uncovered region 142 (FIGS. 18 and 19) at one of edges 160, 162 of link 120 (latter shown in FIGS. 18-20). While only one gate structure 140A is partially over link 120, FIG. 18 shows two gate structures 140A, 140B illustrating the repeating nature of gate structures and how they can be arranged to achieve a single silicide region 150 at one of edges 160, 162 of link 120, i.e., with one gate structure 140B not over link 120. In this example, silicide region 150 includes first edge 156 over link 120 (and at edge of gate structure 140A) and second edge 158 at second edge 162 of link 120. Gate structure 140A is over an opposing edge surface (170 as shown) at an opposing edge (160 as shown) of link 120. Silicide region 150 has a silicide width W2, which can be defined based on where gate structure 140A is located over link 120, vertically as shown.

Figure 21:
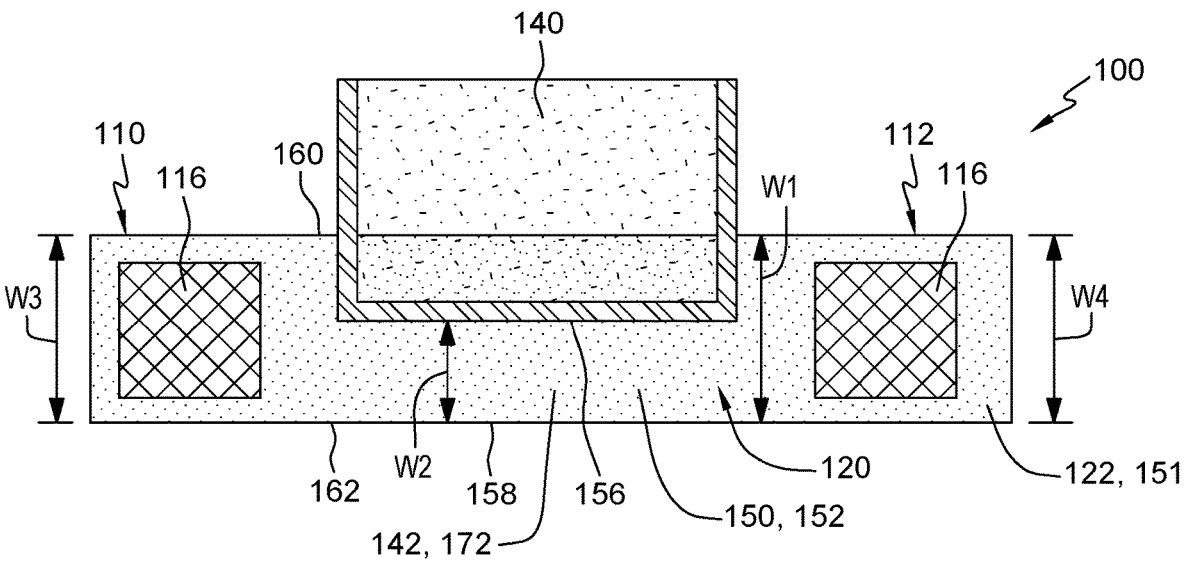
FIG. 21 shows a top-down view of an electrically programmable fuse, according to other embodiments of the disclosure.
Figure 22:
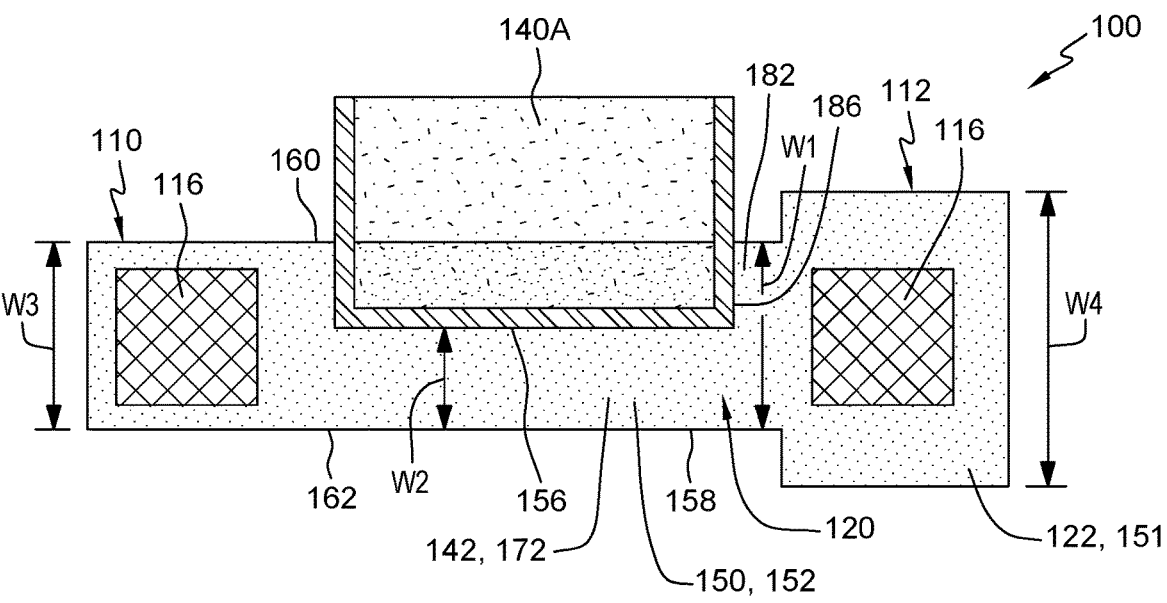
FIG. 22 shows a top-down view of an electrically programmable fuse, according to yet other embodiments of the disclosure.
Figure 23:
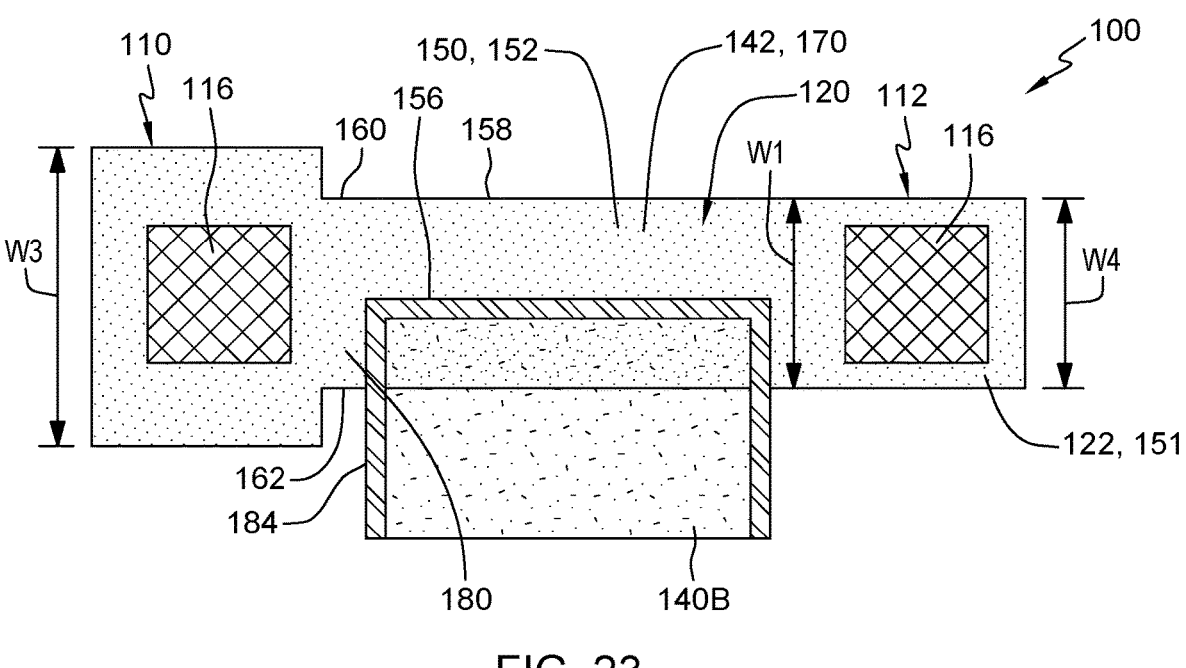
FIG. 23 shows a top-down view of an electrically programmable fuse, according to other embodiments of the disclosure.

FIGS. 21-23 show top-down views of other embodiments of e-fuse 100 based on the FIGS. 18-20 embodiments. In FIG. 21, in semiconductor layer 122, first contact 110 and second contact 112 have respective widths W3, W4 defined perpendicular to the longitudinal axis A (FIG. 18) that are the same as link width W1, but larger than silicide width W2. In FIGS. 18, 20 and 21, first and second contacts 110, 112 may have the same widths, i.e., W3=W4, in semiconductor layer 122 (they may also be the same or different lengths (along axis A) in semiconductor layer 122). However, as shown in FIGS. 22 and 23, first and second contacts 110, 112 may have different widths, i.e., W3/W4, in semiconductor layer 122. They may be the same or different lengths (along axis A) in semiconductor layer 122. FIGS. 18 and 20 include silicide end regions 180, 182 between ends 184, 186, respectively, of gate structure 140A and the wider semiconductor layer 122 parts of first and second contacts 110, 112. In contrast, in FIG. 22, only silicide end region 182 exists between end 186 of gate conductor 140A and wider semiconductor layer 122 part of second contact 112, and in FIG. 23, only silicide end region 182 exists between end 184 of gate conductor 140A and wider semiconductor layer 122 part of first contact 110. The FIGS. 18, 20, 22 and 23 embodiments include one or more of silicide end regions 180, 182, but alternatively, gate structure 140A or 140B could extend over the wider semiconductor layer 122 parts of first contact 120 and/or second contact 112 to eliminate silicide end region(s) 180, 182.

FIG. 23 also shows an embodiment in which first end surface 170 at first edge 160 of link 120 includes uncovered region 142 rather than second end surface 172 at second edge 162 of link 120. In this case, silicide region 150 is within first end surface 170 at first edge 160 of link 120.

Figure 24A:
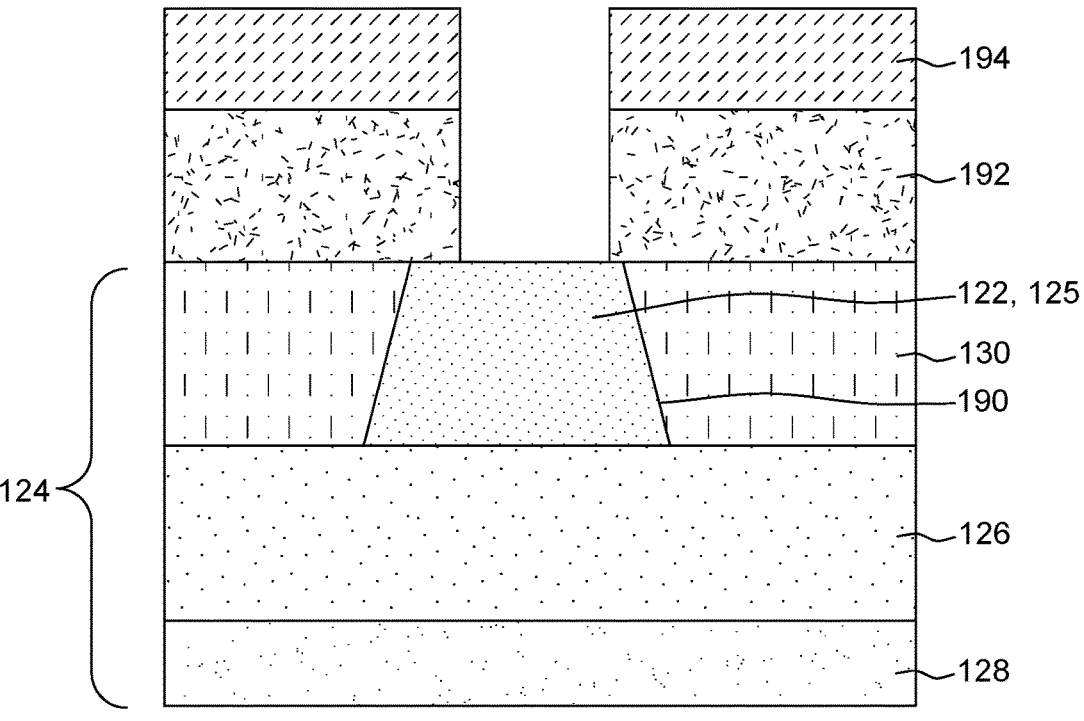
FIGS. 24A-C show cross-sectional views of a method of forming an electrically programmable fuse, according to embodiments of the disclosure.
Figure 24B:
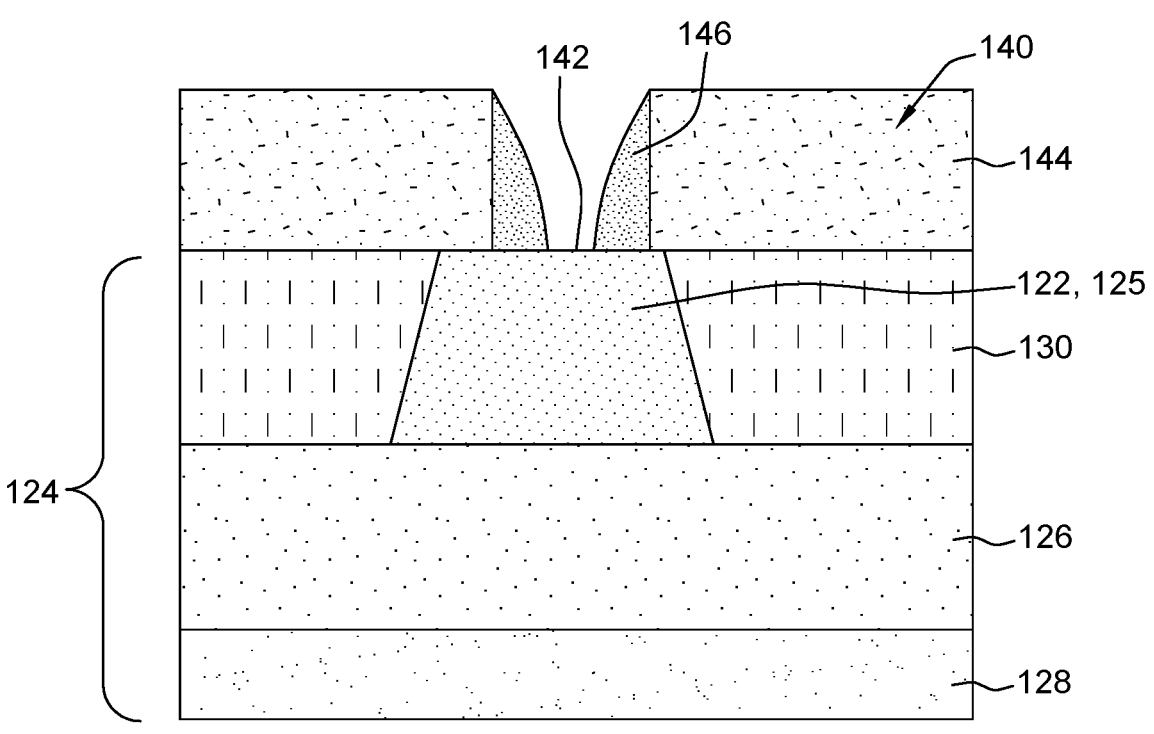
Figure 24C:
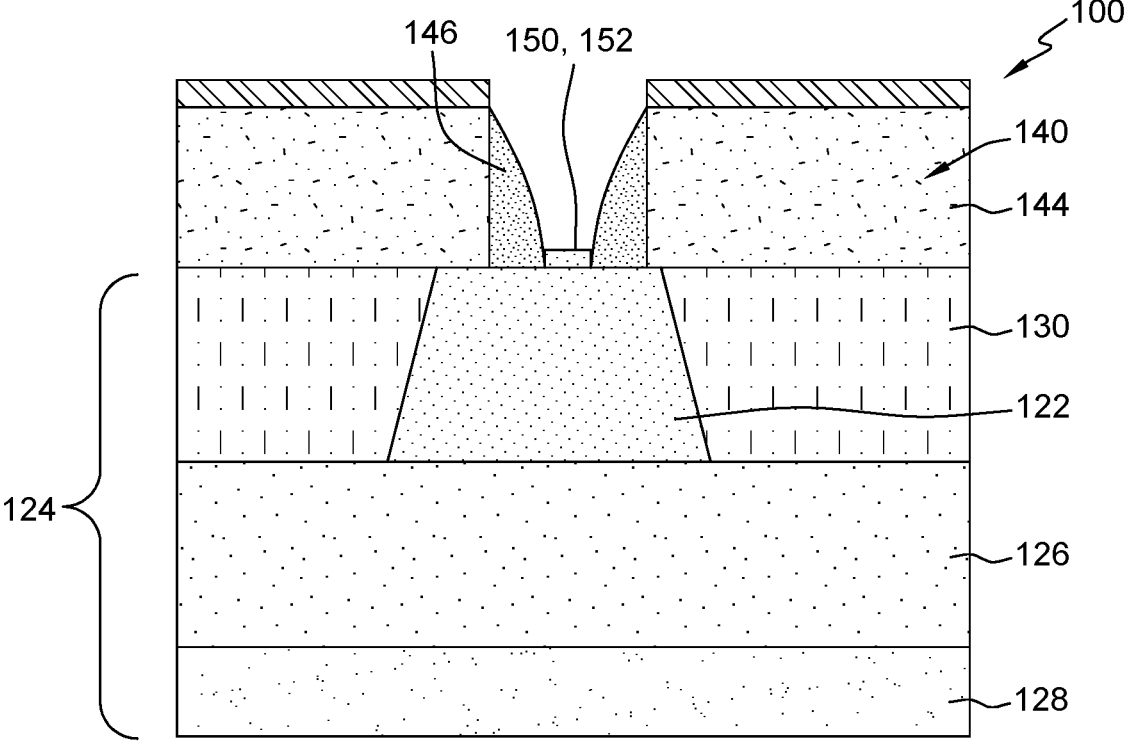
Figure 25A:
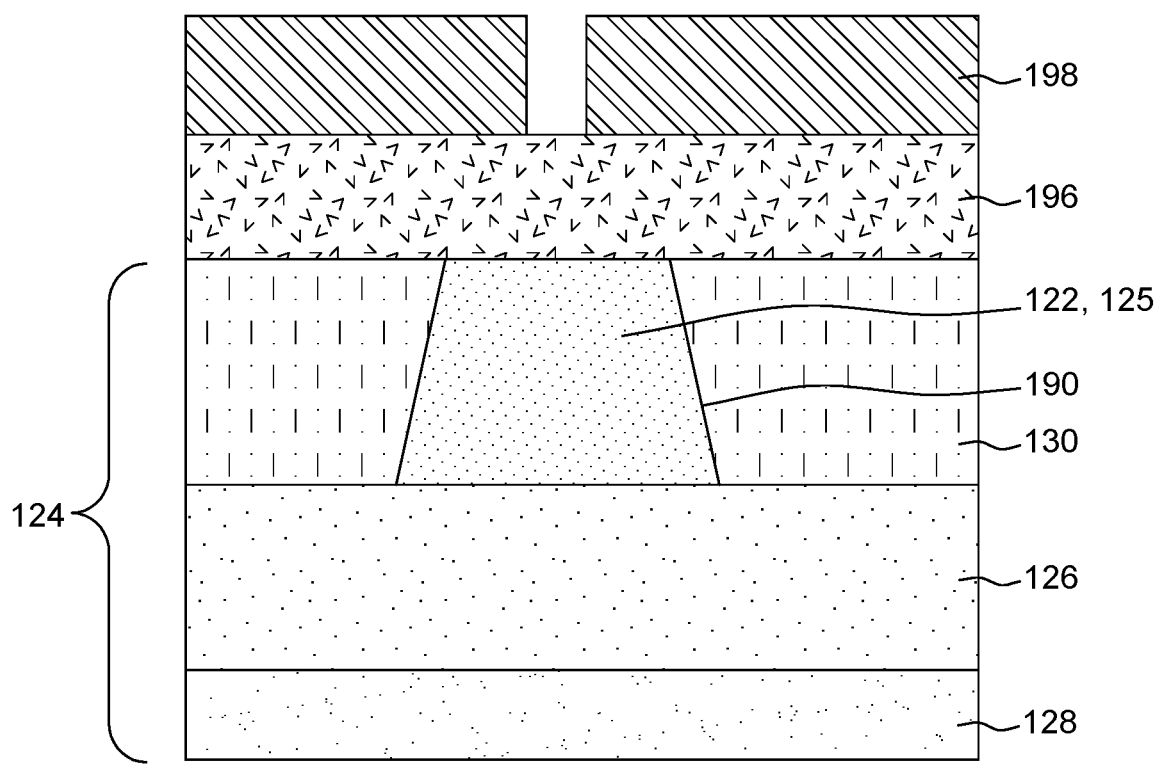
FIGS. 25A-C show cross-sectional views of a method of forming an electrically programmable fuse, according to other embodiments of the disclosure.

FIGS. 24A-C and 25A-C show cross-sectional views of various embodiments of methods of forming e-fuse 100. As shown in FIGS. 24A and 25A, each method includes forming semiconductor fuse element 125 in semiconductor layer 122. As shown in, for example, FIG. 1, semiconductor fuse element 125 includes first contact 110, second contact 112 spaced from first contact 110 and link 120 between and electrically connecting first contact 110 and second contact 112. Semiconductor fuse element 125 may be formed using any now known or later developed semiconductor fabrication techniques. In one embodiment, semiconductor layer 122 may be deposited and isolation structures 130 may be formed therein using any now known or later developed techniques. For example, a mask may be patterned over semiconductor layer 122 and a trench 190 etched into semiconductor layer 122 (in shape of fuse element 125) and filled with an insulating material such as oxide. Further planarization can remove excess material.

The process of forming gate structure(s) 140 partially over link 120, leaving uncovered link region 142 uncovered by gate structure(s) 140 can take different forms depending on the type of gate structure being used in the IC structure. FIGS. 24A-B show forming gate structure(s) 140 where it includes polysilicon. In this case, gate structure(s) 140 may include forming a polysilicon layer 192 over electrically programmable fuse element 125, and patterning polysilicon layer 192 using a mask 194 (using an etch) to expose uncovered link region 142. A gate dielectric layer (not shown) may also be part of body 144 of gate structure(s) 140. Mask 194 can be removed after the patterning. Spacer(s) 146 can be formed to refine the size and shape of uncovered link region 142. Spacer(s) 146 may be formed by depositing a sidewall spacer material (as previously listed herein) and etching to remove excess material. As noted, spacer(s) 146 may include a number of layers. In any event, gate structure(s) 140 (FIG. 24B) leave uncovered link region 142.

Figure 25B:
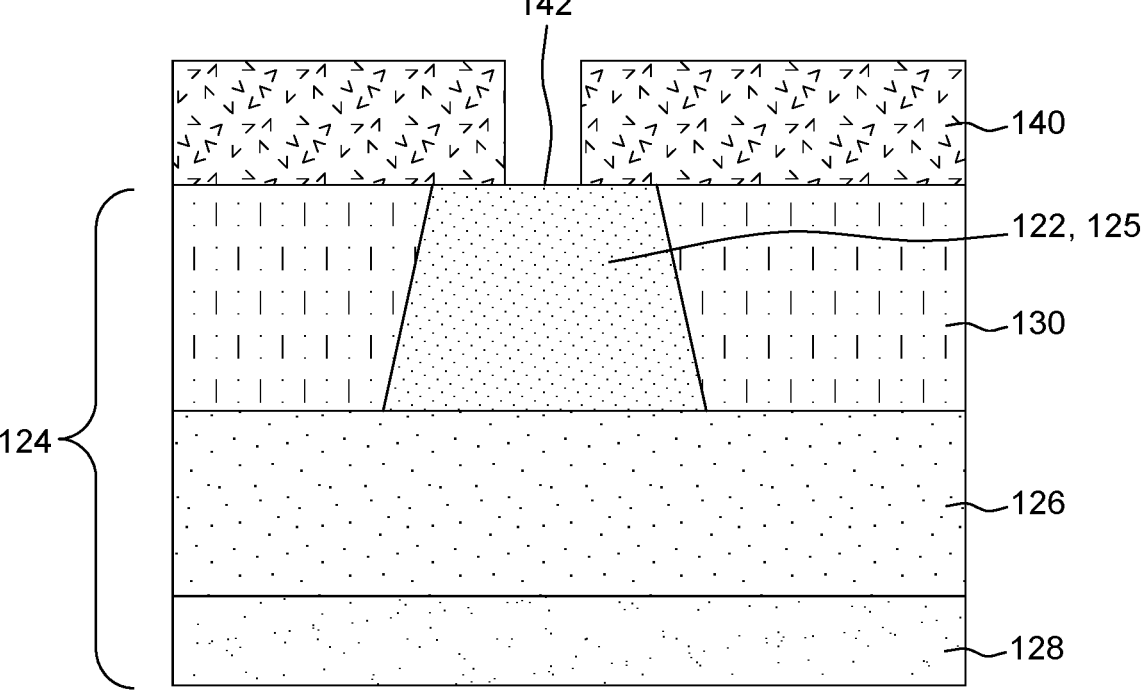

For an alternative embodiment, FIGS. 25A-B show forming gate structure(s) 140 by forming at least one metal layer 196 over e-fuse element 125 and patterning metal layer(s) 196 to expose uncovered link region 142, e.g., using a patterned hard mask 198 and etching. A gate dielectric layer (not shown) may also be part of body 144 of gate structure(s) 140. Mask 198 can be removed after the patterning. Spacer(s) 146 can be formed to refine the size and shape of uncovered link region 142. Spacer(s) 146 may be formed by depositing a sidewall spacer material (as previously listed herein) and etching to remove excess material. In any event, gate structure(s) 140 (FIG. 25B) leave uncovered link region 142.

Figure 25C:
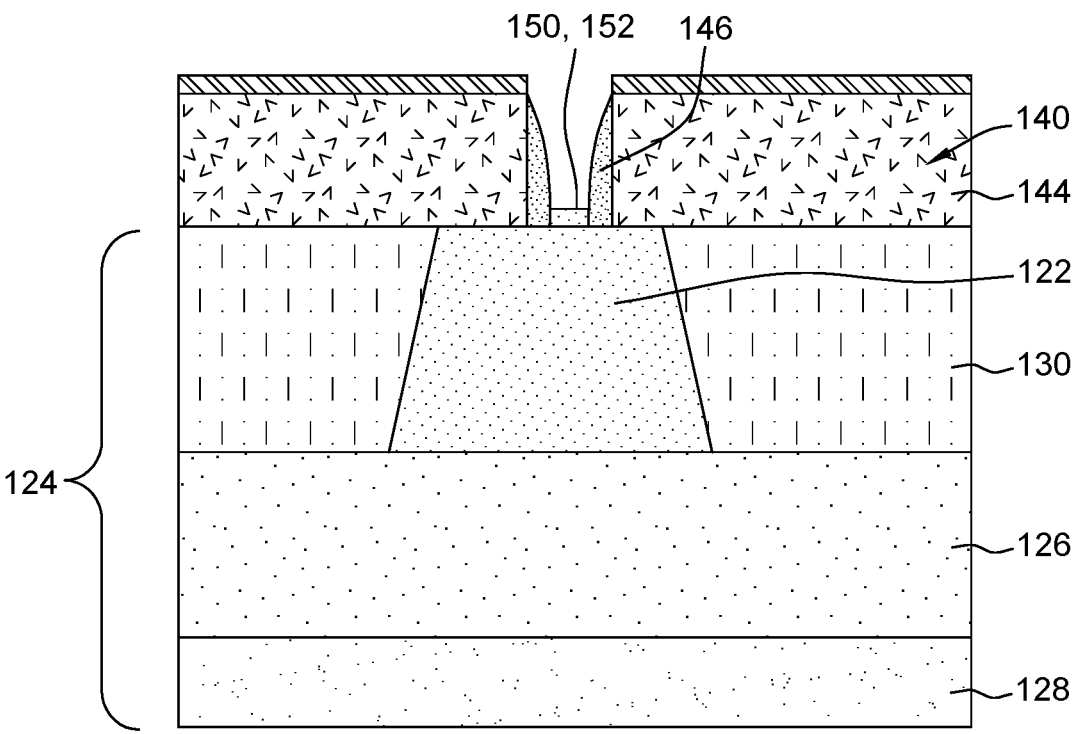

FIGS. 24C and 25C show forming silicide region 150 within uncovered link region 142. Silicide region 150 may be formed using any now known or later developed technique, e.g., performing an in-situ pre-clean, depositing a metal such as titanium, nickel, cobalt, etc., annealing to have the metal react with semiconductor layer 122, and removing unreacted metal. Subsequent processing may include any now known or later middle-of-line (MOL) or back-end-of-line (BEOL) interconnect fabrication to form any necessary ILD layers and electrical interconnects such as contacts 116 for first and second contacts 110, 112, and wires/contacts to, for example, various transistors (not shown) of circuit source 118.

While FIGS. 24A-C and 25A-C show forming silicide region 150 as in the FIGS. 1-6 embodiments, it will be recognized by those with skill in the art that the teachings are equally applicable, with modifications in position of gate structure(s) 140, to the other embodiments described herein.

Embodiments of the disclosure provide various technical and commercial advantages, examples of which are discussed herein. Gate structure(s) 140 blocks silicide region 150 formation over an entirety of fuse link 120, effectively reducing the width of the fuse link, reducing the magnitude of programming current and the overall size of the electrically programmable fuse (i.e., by reducing the size of programming current source and programming transistors). Effective fuse link 152 width (i.e., silicide width W2) is not limited to gate structure conductor width for the technology node in which used; rather, only design rules limit effective fuse link 152 width. E-fuse 100 can be formed using current semiconductor/transistor fabrication processing and does not require additional masks or processing. In one non-limiting example, for a technology node at which polyconductor gate structure minimum width is normally 130 nanometers (nm), e-fuse 100 can have an effective fuse link 152 having a 60 nm width, a greater than 50% reduction in width.

The structure and method as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An electrically programmable fuse, comprising:
a first contact;
a second contact spaced from the first contact;
a link between and electrically connecting the first contact and the second contact, wherein the first contact, the second contact and the link include semiconductor material;
a gate structure partially over the link, wherein an uncovered link region is uncovered by the gate structure, wherein the gate structure includes a body including one of a polysilicon and a metal, and a spacer adjacent a sidewall of the body; and
a silicide region within the uncovered link region, wherein the link, the first contact and the second contact define a longitudinal axis, and the silicide region has a silicide width defined perpendicular to the longitudinal axis between a first edge of the silicide region that is parallel to the longitudinal axis and a second edge of the silicide region that is parallel to the longitudinal axis, and
wherein the silicide region includes a first silicide region within a first edge surface at the first edge of the link and a second silicide region within a second edge surface at the second edge of the link, and wherein the gate structure is over a portion of the link and, in a direction of the silicide width, between the first silicide region and the second silicide region, and wherein each of the first and second silicide regions has a respective width that is a portion of the silicide width.

2. The electrically programmable fuse of claim 1, wherein at least one of the first contact and the second contact have a width defined perpendicular to the longitudinal axis larger than a link width defined perpendicular to the longitudinal axis between a first edge of the link and a second edge of the link.

3. The electrically programmable fuse of claim 1, wherein the gate structure is over a center portion of the link.

4. The electrically programmable fuse of claim 1, wherein the link has a link length between the first contact and the second contact and the first and second silicide regions are over an entirety of the link length.

5. The electrically programmable fuse of claim 1, wherein the link has a link length between the first contact and the second contact and the gate structure is over only a portion of the link length.

6. An electrically programmable fuse, comprising:
a semiconductor fuse element including a first contact, a second contact spaced from the first contact and a link between and electrically connecting the first contact and the second contact;
a gate structure partially over the link, wherein an uncovered link region is uncovered by the gate structure, the link has a link length between the first contact and the second contact, and the gate structure is also over a portion of the link length and a portion of at least one of the first contact and the second contact, wherein the gate structure includes a body including one of a polysilicon and a metal, and a spacer adjacent a sidewall of the body; and
a silicide region within the uncovered link region.

7. The electrically programmable fuse of claim 6, wherein the link, the first contact and the second contact define a longitudinal axis, and the silicide region has a silicide width defined perpendicular to the longitudinal axis between a first edge of the link and a second edge of the link.

8. The electrically programmable fuse of claim 7, wherein the silicide region is between the first edge of the link and the second edge of the link.

9. The electrically programmable fuse of claim 7, wherein the silicide region is within only one of a first edge surface at the first edge of the link and a second edge surface at the second edge of the link and the gate structure is over a remaining portion of the link.

10. The electrically programmable fuse of claim 6, wherein the link has a link length between the first contact and the second contact and the silicide region extends an entirety of the link length.

11. The electrically programmable fuse of claim 6, wherein the gate structure is over an entirety of the link length.

12. A method, comprising:

forming a semiconductor fuse element in a semiconductor layer, the semiconductor fuse element including a first contact, a second contact spaced from the first contact and a link between and electrically connecting the first contact and the second contact;

forming a gate structure partially over the link and over a portion of at least one of the first contact and the second contact, wherein an uncovered link region is uncovered by the gate structure, wherein forming the gate structure includes at least one of:

forming a polysilicon layer over the electrically programmable fuse element and patterning the polysilicon layer to expose the uncovered link region, and forming at least one metal layer over the electrically programmable fuse element and patterning the at least one metal layer to expose the uncovered link region; and forming a silicide region within the uncovered link region.

13. The method of claim 12, wherein forming the gate structure includes forming a spacer adjacent a sidewall of the body.

\* \* \* \* \*